(12) United States Patent
Saito et al.

(10) Patent No.: US 6,465,844 B2
(45) Date of Patent: Oct. 15, 2002

(54) POWER SEMICONDUCTOR DEVICE AND METHOD OF MANUFACTURING THE SAME

(75) Inventors: Wataru Saito, Kawasaki (JP); Ichiro Omura, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/904,888

(22) Filed: Jul. 16, 2001

(65) Prior Publication Data
US 2002/0005549 A1 Jan. 17, 2002

(30) Foreign Application Priority Data

Jul. 17, 2000 (JP) ......................................... 2000-215290
Feb. 27, 2001 (JP) ......................................... 2001-051439

(51) Int. Cl.[7] ......................... H01L 29/76; H01L 29/94; H01L 31/062; H01L 31/113
(52) U.S. Cl. ......................... 257/336; 257/335; 257/341
(58) Field of Search ......................... 257/335, 336, 257/337, 339, 341, 342

(56) References Cited

U.S. PATENT DOCUMENTS

| | | | |
|---|---|---|---|
| 5,216,275 A | 6/1993 | Chen | |
| 5,637,898 A | * 6/1997 | Baliga | 257/330 |
| 6,037,632 A | 3/2000 | Omura et al. | |
| 6,066,878 A | 5/2000 | Neilson | |
| 6,326,656 B1 | * 12/2001 | Tihanyi | 257/288 |

OTHER PUBLICATIONS

Holger Kapels, et al., "Dielectric Charge Traps: A New Structure Element for Power Devices", Proceedings of IEEE ISPSD 2000, May 22–25, 2000, Toulouse, France, pp. 205–208.

* cited by examiner

*Primary Examiner*—Ngân V. Ngô
(74) *Attorney, Agent, or Firm*—Oblon, Spivak, McClelland, Maier & Neustadt, P.C.

(57) ABSTRACT

A power semiconductor device has a plurality of U-shaped buried layers buried in a drift layer and made of either an insulating material or a semiconductor having a wider bandgap than that of the semiconductor of the drift layer. The ratio of the product of the height H of the U-shaped buried layers and the arrangement pitch d to the spacing g between adjacent ones of the U-shaped buried layers is expressed as $Hd/g \leq 13.2$. With this configuration, a power semiconductor device having both a high breakdown voltage and a low on resistance can be realized.

7 Claims, 23 Drawing Sheets

POWER SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Applications No. 2000-215290, filed Jul. 17, 2000; and No. 2001-051439, filed Feb. 27, 2001, the entire contents of both of which are incorporated herein by reference.

BACKGROUND OF THE INVENTION

1. Field of the Invention

This invention relates to a power semiconductor device, such as a vertical power MOSFET, and a method of manufacturing the same.

2. Description of the Related Art

The on-resistance of a vertical power MOSFET depends largely on the electric resistance of the conduction layer (drift layer) part. The dopant concentration that determines the electric resistance of the drift layer is restricted by the breakdown voltage of the p-n junction formed by the body and the drift layer and cannot be raised above the limit. Therefore, there is a tradeoff relationship between the element breakdown voltage and the on-resistance. It is important to improve the tradeoff in decreasing the power loss of a power semiconductor device. The tradeoff has a limit determined by the element material. Exceeding the limit is a key to realizing a low on-resistance element that outperforms the existing power elements.

One known method of realizing a low on-resistance that exceeds the limit of the material is to use an element structure where an insulating layer having a shape for trapping carriers, such as a buried layer made of an oxide layer, is buried in a drift layer (for example, Holger Kapers et al., "Dielectric Charge Traps: A New Structure Element for Power Devices", ISPSD'2000, May 22–25, Toulouse, France, pp. 205–208).

The literature has disclosed a configuration where a plurality of charge traps are provided in a power element and described the effect using simulation. To put the configuration to practical use, however, it is necessary to determine the structure of concrete charge traps and establish a method of manufacturing the charge traps.

This invention was made considering the above situation. Therefore, the object of the present invention is to provide a power semiconductor device capable of improving the tradeoff between the element breakdown voltage and the on-resistance and a method of manufacturing the same.

BRIEF SUMMARY OF THE INVENTION

The foregoing object is accomplished by providing a power semiconductor device comprising: a first semiconductor layer of a first conductivity type having a first and a second main surface that oppose to each other; a first main electrode electrically connected to the second main surface of the first semiconductor layer; a second semiconductor layer of a second conductivity type selectively formed on the first main surface of the first semiconductor layer; a third semiconductor layer of the first conductivity type selectively formed on the surface of the second semiconductor layer; a second main electrode electrically connected to the surface of the second semiconductor layer and a surface of the third semiconductor layer; a gate electrode formed via a gate insulating film above the third semiconductor layer, the second semiconductor layer, and the first semiconductor layer; and buried layers whose cross section is shaped like a letter U and which are made of either an insulating layer or a semiconductor layer having a wider bandgap than that of the first semiconductor layer and are provided in the first semiconductor layer in such a manner that a set of at least two of the buried layers are arranged with a pitch of d and a spacing of g in a horizontal direction perpendicular to a vertical direction passing through the first main electrode and the second main electrode and at least one stage of the set of at least two buried layers is arranged in the vertical direction, wherein a ratio A of a product of a height H of the U-shaped buried layers and the arrangement pitch d to the spacing g between adjacent ones of the U-shaped buried layers is expressed as:

$$A(=Hd/g) \leq 13.2$$

With this configuration of the power semiconductor device, the ratio B of the sum of the width W and height H of the U-shaped buried layers to the arrangement pitch d is expressed as:

$$B(=(W+H)/d) \leq 0.3$$

A power semiconductor device manufacturing method according to the present invention comprises: a first step of forming a fourth semiconductor layer having a third and a fourth main surface that oppose to each other; a second step of forming a trench whose cross section is shaped like a letter U by etching the third main surface of the fourth semiconductor layer; a third step of forming U-shaped buried layers by implanting oxygen or nitrogen ions into an inner wall face of the trench; a fourth step of forming a fifth semiconductor layer of a first conductivity type whose surface is flat on the fourth semiconductor layer including the inside of the trench; forming an (n+4)-th semiconductor layer of the first conductivity type at the top surface by repeating the first to the fourth step n times (n is an integer) and thereby forming a first stacked semiconductor layer where the fourth semiconductor layer is at a bottom and the (n+4)-th layer is at the top; forming a first main electrode electrically connected to a second main surface of the first stacked semiconductor layer, which is equal to the fourth main surface of the fourth semiconductor layer, after the forming of the first stacked semiconductor layer; selectively forming a second semiconductor layer of the second conductivity type on a first main surface of the first stacked semiconductor layer after the forming of the first stacked semiconductor layer; selectively forming a third semiconductor layer of the first conductivity type on a surface of the second semiconductor layer; forming a second main electrode so as to be joined to the surface of the second semiconductor layer and a surface of the third semiconductor layer; and forming a gate electrode via a gate insulating film above the third semiconductor layer, the second semiconductor layer, and the first semiconductor layer.

Furthermore, a power semiconductor device according to the present invention comprises: a first semiconductor layer of a first conductivity type having a first and a second main surface that oppose to each other; a first main electrode electrically connected to the second main surface of the first semiconductor layer; a second semiconductor layer of a second conductivity type selectively formed on the first main surface of the first semiconductor layer; a third semiconductor layer of the first conductivity type selectively formed on a surface of the second semiconductor layer; a second main electrode formed so as to be joined to the surface of the second semiconductor layer and a surface of the third semiconductor layer; a gate electrode formed via a gate insulating film above the third semiconductor layer, the second semiconductor layer, and the first semiconductor layer; and a plurality of buried layers buried in the first semiconductor layer, each of the buried layers having a stacked film of an insulating layer shaped substantially like a letter U and a polysilicon layer formed on the insulating layer.

Furthermore, a power semiconductor device according to the present invention comprises: a first semiconductor layer of a first conductivity type having a first and a second main surface that oppose to each other; a first main electrode electrically connected to the second main surface of the first semiconductor layer; a second semiconductor layer of a second conductivity type selectively formed on the first main surface of the first semiconductor layer; a third semiconductor layer of the first conductivity type selectively formed on a surface of the second semiconductor layer; a second main electrode formed so as to be joined to the surface of the second semiconductor layer and a surface of the third semiconductor layer; a gate electrode formed via a gate insulating film above the third semiconductor layer, the second semiconductor layer, and the first semiconductor layer; and a plurality of buried layers which are buried in the first semiconductor layer and each of which is made of either an insulating layer or a semiconductor layer having a wider bandgap than that of the first semiconductor layer and has a side and a bottom part with a U-shaped cross section and a cap part with an opening smaller in inside diameter than the side part of the U-shaped part.

Furthermore, a power semiconductor device according to the present invention comprises: a first semiconductor layer of a first conductivity type which has a first and a second main surface that oppose to each other and further has a central region in which an active element is formed and a termination region enclosing the central region; a first main electrode electrically connected to the second main surface of the first semiconductor layer; a second semiconductor layer of a second conductivity type selectively formed in the central region of the first main surface of the first semiconductor layer; a third semiconductor layer of the first conductivity type selectively formed at the surface of the second semiconductor layer; a second main electrode electrically connected to the surface of the second semiconductor layer and a surface of the third semiconductor layer; a gate electrode formed via a gate insulating film above the third semiconductor layer, the second semiconductor layer, and the first semiconductor layer; a plurality of first buried layers whose cross section is shaped like a letter U and which are made of either an insulating layer or a semiconductor layer having a wider bandgap than that of the first semiconductor layer and are provided in the first semiconductor layer in such a manner that at least two of the first buried layers are arranged in a horizontal direction perpendicular to a vertical direction passing through the first main electrode and the second main electrode and at least one stage of a set of at least two first buried layers is arranged in the vertical direction; and a plurality of second U-shaped buried layers provided in the first semiconductor layer in the termination region, wherein shapes and arrangements of the plurality of second U-shaped buried layers are different from those of the plurality of first U-shaped buried layers in the central region.

Furthermore, a power semiconductor device according to the present invention comprises: a first semiconductor layer of a first conductivity type having a first and a second main surface that oppose to each other; a first main electrode electrically connected to the second main surface of the first semiconductor layer; a second semiconductor layer of a second conductivity type selectively formed on the first main surface of the first semiconductor layer; a third semiconductor layer of the first conductivity type selectively formed on a surface of the second semiconductor layer; a second main electrode electrically connected to the surface of the second semiconductor layer and a surface of the third semiconductor layer; a gate electrode formed via a gate insulating film above the third semiconductor layer, the second semiconductor layer, and the first semiconductor layer; anyone selected from the group consisting of buried layers whose cross section is shaped like a letter U and which are made of either an insulating layer or a semiconductor layer having a wider bandgap than that of the first semiconductor layer, and a fourth semiconductor layer of the second conductivity type; and a Schottky barrier diode provided on the first semiconductor layer and connected in parallel with a built-in diode formed between the second semiconductor layer and the first semiconductor layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIG. 8A is a sectional view and FIG. 8B is a plan view;

FIG. 26A is a sectional view and FIG. 26B is a plan view.

DETAILED DESCRIPTION OF THE INVENTION

Figure 1:
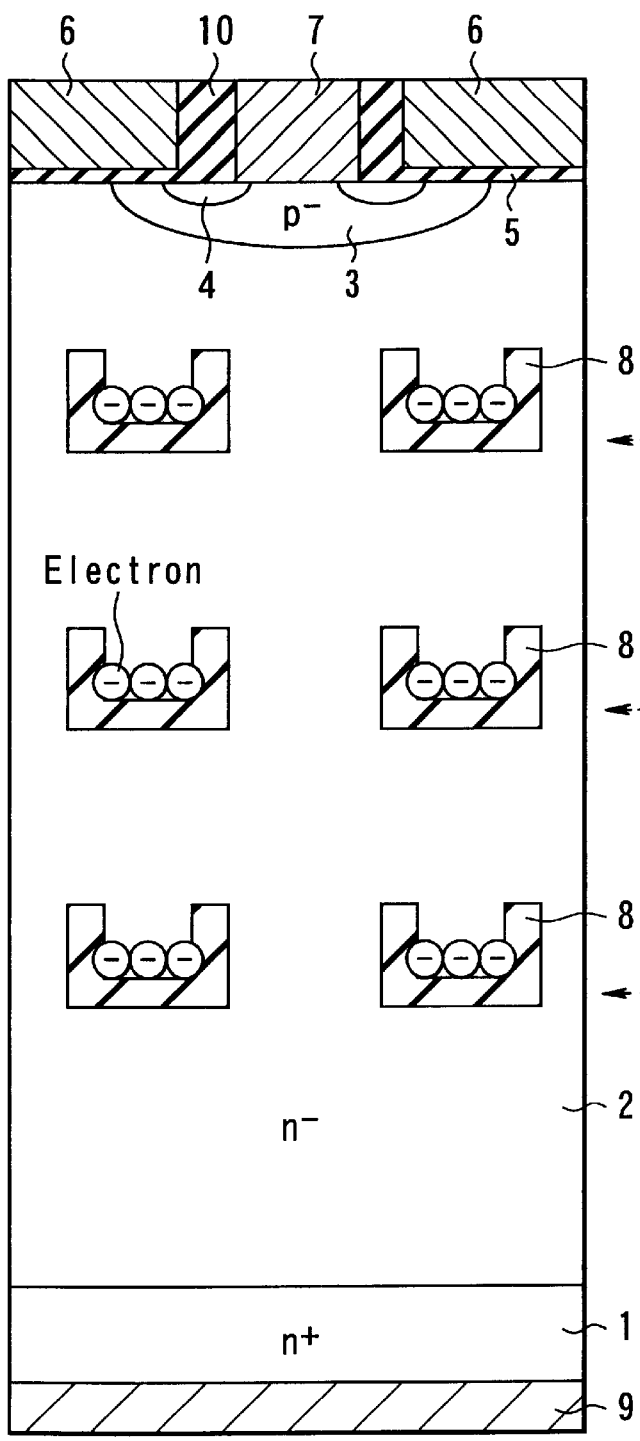
FIG. 1 is a sectional view of a power MOSFET that has U-shaped insulators buried in a drift layer and constitutes one of the basic configurations of embodiments of the present invention, which helps to explain a method of realizing a high breakdown voltage and a low on-resistance.
Figure 2:
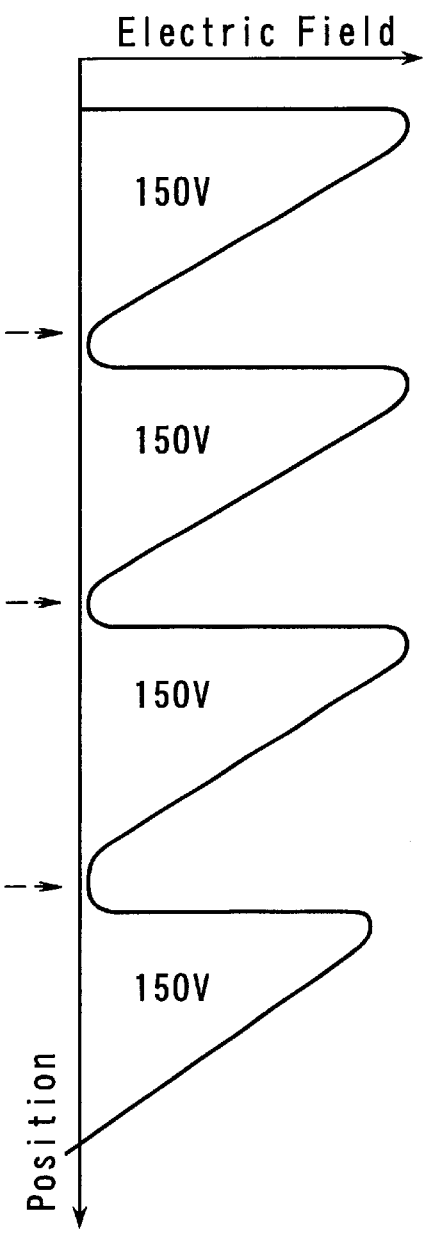
FIG. 2 is a diagram to help explain electric field division in FIG. 1.

Before explanation of embodiments of the preset invention, the principle of realizing a high breakdown voltage and a low on voltage in a power semiconductor device with buried layers constituting one basic configuration in the present invention. FIG. 1 is a cross-sectional structure of a vertical MOSFET where U-shaped buried layers are buried. FIG. 2 shows a vertical electric field distribution in the drift layer when a high voltage is applied.

On an $n^+$ silicon substrate 1, an $n^-$ drift layer 2 is formed. At the surface of the $n^-$ drift layer 2, a $p^-$ well layer 3 is selectively formed. At the surface of the $p^-$ well layer 3, $n^+$ source layers 4 are selectively formed. Above the $n^+$ source layers 4 and $n^-$ drift layer 2, gate electrodes 6 are formed via a gate insulating film 5. A source electrode 7 is formed on the $p^-$ well layer 3 and $n^+$ source layer 4 in such a manner that the electrode 7 connects to the $p^-$ well layer 3 and $n^+$ source layers 4. In the $n^-$ drift layer 2, a plurality of buried layers 8 are buried. On the bottom surface of the $n^+$ silicon substrate 1, a drain electrode 9 is provided. In this structure, carriers are trapped in the buried layers 8, thereby dividing an electric field in the $n^-$ drift layer 2 as shown in FIG. 2. Consequently, even when the dopant concentration of the $n^-$ drift layer 2 is raised to decrease the on-resistance, the original breakdown voltage can be maintained, which enables a low on-resistance exceeding the limit to be realized.

The element breakdown voltage of the power semiconductor device shown in FIG. 1 is determined by the number of carriers trapped in the parts enclosed by the buried layers 8. As the buried layers 8 are made larger to increase the number of carriers trapped, the area of the conducting path of the $n^-$ drift layer 2 becomes smaller, which increases the on-resistance. Therefore, the buried layers have to be formed in such a manner that they obstruct the conducting path as little as possible. Since the on-resistance of the power element depends on the intervals at which the buried layers are arranged laterally, it is desirable that the buried layers should be formed into the shape of U as shown in FIG. 1.

In epitaxial growth generally used in forming a drift layer, the substrate temperature is high. As a result, the oxide layer formed as the buried layers evaporates, part of the oxide layer differs in thickness from the remaining part, and if worst comes to worst, a hole develops in the oxide layer, which makes it difficult to form buried oxide layers.

Taking these problems into account, this invention has been made. Embodiments of the present invention will be explained by reference to the accompanying drawings. To make it easier to understand explanation, like parts are indicated by corresponding reference numerals throughout the embodiments.

In the first to third embodiments, an optimum designing method for buried layers will be explained. A power semiconductor element in each of the first to third embodiments has the same configuration as that of FIG. 1 and is characterized by the dimensions of the buried layers 8 and the intervals at which they are arranged.

(First Embodiment)

The optimum dimensions of the buried layers 8 shown in FIG. 1 can be determined by the relationship between the dimensions of the buried layers and the characteristic of the element. Specifically, the on-resistance of the element depends largely on the resistance of the n⁻ drift layer 2. The resistance of the n⁻ drift layer 2 can be decreased by increasing the dopant concentration of the n⁻ drift layer 2. Inserting buried layers enables the on-resistance of the element to be decreased, with the breakdown voltage remaining unchanged.

On the other hand, electrons running through the part of the n⁻ drift layer 2 sandwiched between adjacent buried layers 8. As the buried layers 8 become larger, the part through which electrons run decreases, which increases the resistance.

The resistance of the part of the n⁻ drift layer 2 sandwiched between adjacent layers 8 arranged side by side is proportional to the length (height) of the n⁻ drift layer 2 and inversely proportional to its cross-sectional area. Specifically, the resistance is inversely proportional to the spacing g between adjacent buried layers 8 and proportional to the height H and pitch d of the buried layers 8 (or the length of the base of the buried layers 8+the spacing g).

If the ratio of the product of the height (groove depth) H of the buried layer 8 and the pitch d to the spacing g is A, the on-resistance is proportional to A as follows:

$$Ron\ H \times d/g = A \quad (1)$$

Figure 3:
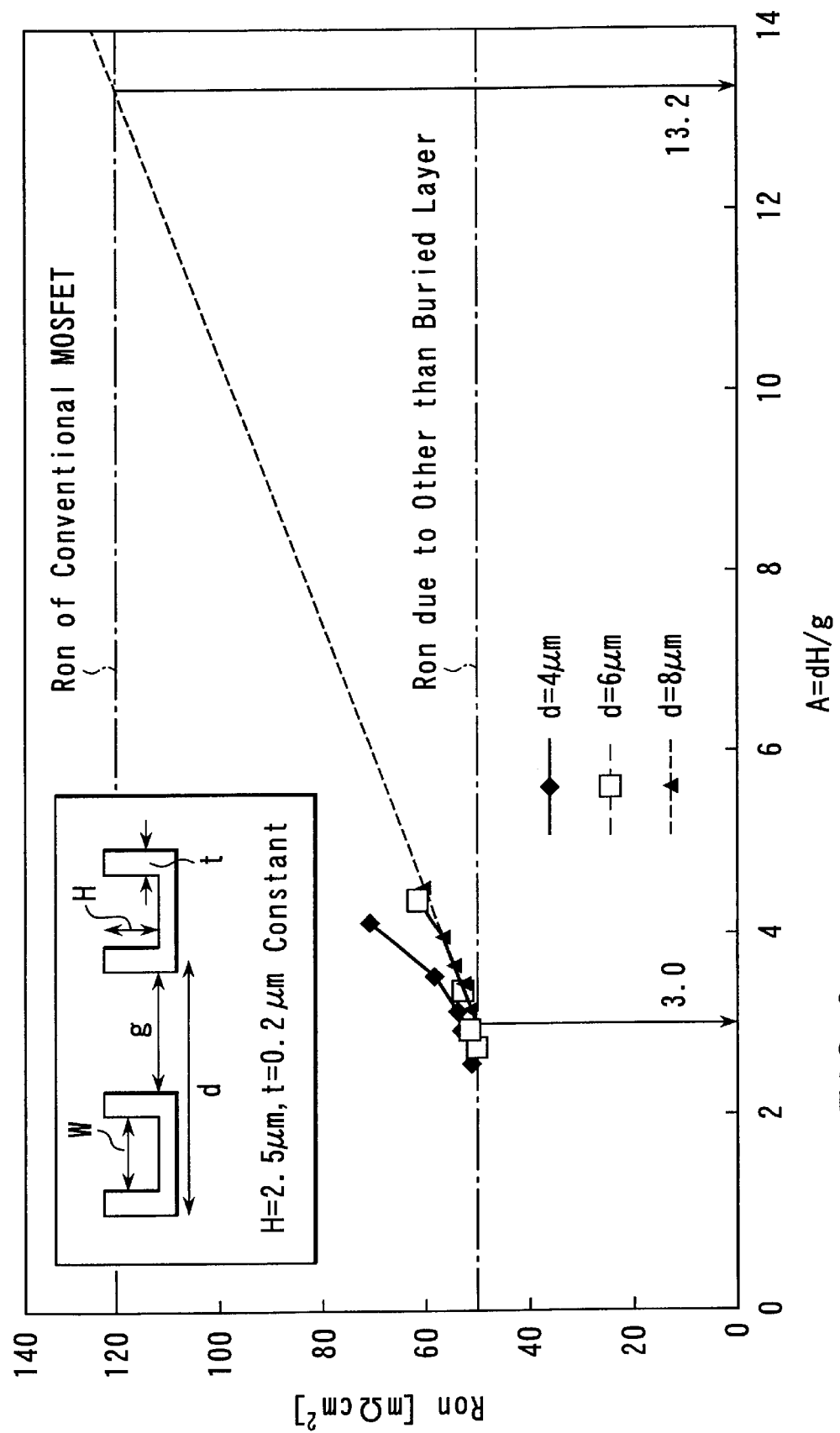
FIG. 3 is a characteristic diagram for determining various dimensions of the U-shaped burred layer of a vertical power MOSFET according to a first embodiment of the present invention.

FIG. 3 shows the result of finding by simulation the relationship between the on-resistance of a MOSFET with a single layer of U-shaped buried layers 8 and the aforementioned A. The result was obtained when the pitch d was changed from 4 to 6 and to 8 $\mu$m. The height of the U-shaped buried layers 8 was set to H=2.5 $\mu$m, their thickness was set to t=0.2 $\mu$m, and the dopant concentration of the n⁻ drift layer 2 was set to $5 \times 10^{14}$ cm⁻³.

As seen from FIG. 3, the on-resistance increases in proportion to A. That is, using A as a parameter enables the on-resistance to be put on a specific proportional straight line without depending on the pitch d. When an increase in the on-resistance is estimated from the result of the analysis, the value of A at which the on-resistance equivalent to that of a conventional MOSFET with no buried layer is reached is 13.2.

By burying such buried layers 8 as have a value of A equal to or smaller than that value (13.2), a low on-resistance is achieved. When buried layers 8 with A equal to or smaller than 3.0 are buried, an increase in the on-resistance caused by the buried layers 8 can be almost ignored. When A becomes larger because of the pitch of 4.0 $\mu$m, the on-resistance becomes greater than that on the proportional straight line. The reason for this is that an increase in the area of the buried layers 8 forces electrons to enter the spacing between buried layers 8 and travel, resulting in an increase in the resistance.

According to the first embodiment, a MOSFET with a lower on-resistance than that of a conventional equivalent can be made easily, with the breakdown voltage remaining unchanged.

(Second Embodiment)

The breakdown voltage of a MOSFET where U-shaped buried layers 8 are buried is proportional to the number of electrons trapped in the buried layers 8. The electrons trapped in each buried layer 8 stay in an accumulation layer formed at the inner wall of the U-shaped buried layer 8. The accumulation layer is formed at the bottom surface and sidewall of the inside of the U-shaped buried layer 8. The number of electrons in the accumulation layer is proportional to the voltage applied to the U-shaped buried layer 8. Since the voltage applied to the bottom surface is uniform, the distribution of electrons is also uniform laterally. As a result, the number of electrons trapped at the bottom surface is proportional to the width. The voltage applied to the sidewall of the U-shaped buried layer 8 decreases almost linearly in the direction of height and becomes zero at the top end.

As described above, since the number of electrons in the accumulation layer formed at the sidewall of the U-shaped buried layer 8 decreases almost linearly in the direction of height, the number of electrons trapped in the sidewall is proportional to 1/2 of the height. Because the accumulation layer is formed at both of the sidewalls, the total number of electrons in both accumulation layers is twice the number of electrons in one accumulation layer, with the result that the total number of electrons is proportional to the height. Consequently, since the number of electrons trapped in one U-shaped buried layer 8 is proportional to the sum of the length of the bottom surface of the U-shaped buried layer 8 and that of its side face, it is proportional to the sum of the width w and height H.

Then, since the number of electrons trapped in the U-shaped buried layer 8 is proportional to the number of electrons at the surface of the U-shaped buried layer 8, it is inversely proportional to the arrangement pitch d of the U-shaped buried layers 8. From these, if the ratio of the sum of the width W and H of the U-shaped buried layers 8 to the pitch d is B, the breakdown voltage is proportional to B as follows:

$$VB\ (W+H)/d = B \quad (2)$$

Figure 4:
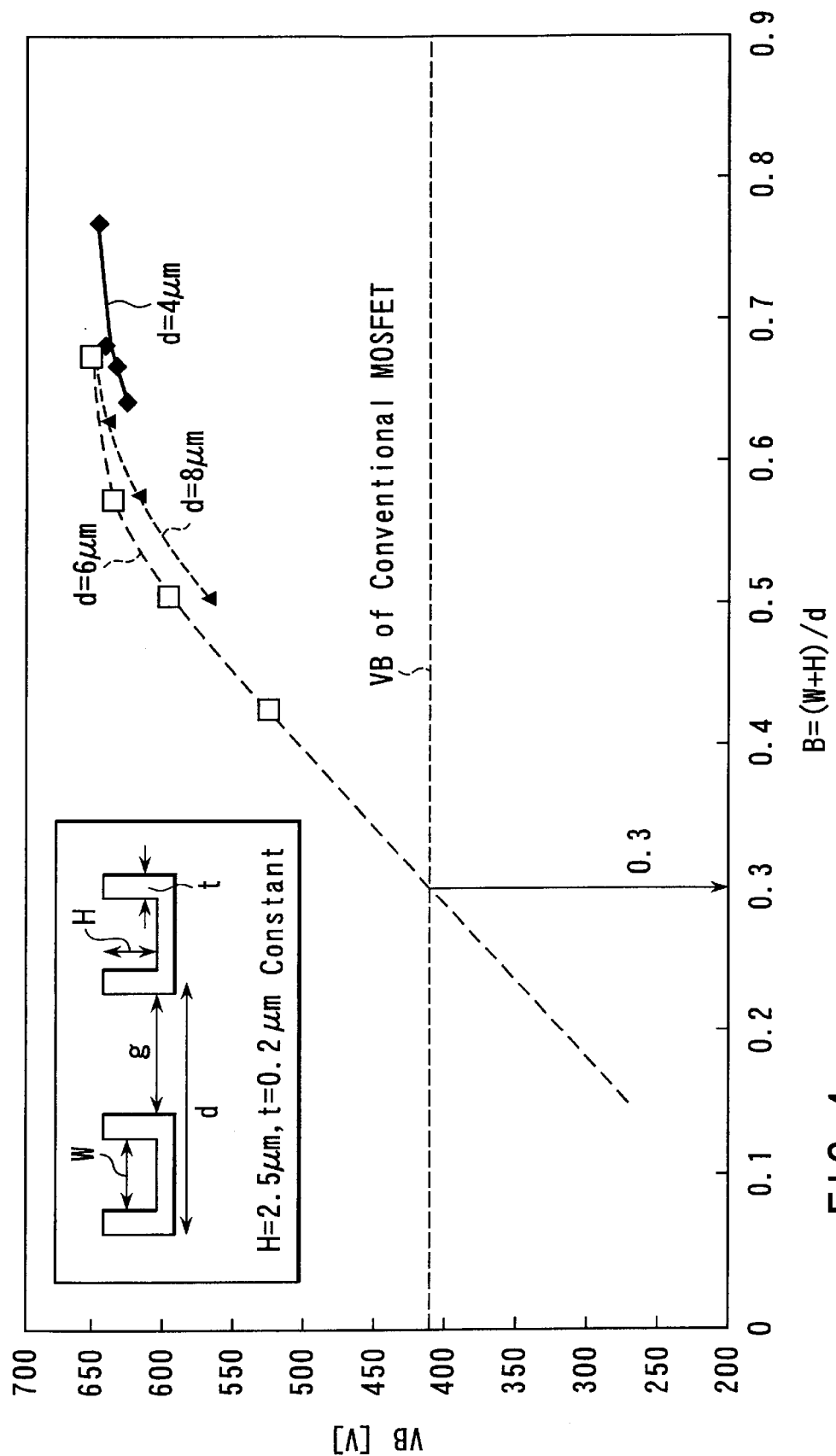
FIG. 4 is a characteristic diagram for determining various dimensions of the U-shaped burred layers of a vertical power MOSFET according to a second embodiment of the present invention.

FIG. 4 shows the result of determining the breakdown voltage of a MOSFET with a single layer of U-shaped buried layers with respect to the ratio B through analysis. FIG. 4 shows the result obtained when the pitch d was changed from 4 to 6 and to 8 $\mu$m. Let the height of the U-shaped buried layers 8 be H=2.5 $\mu$m, their thickness be t=0.2 $\mu$m, and the dopant concentration of the drift layer 2 be $5 \times 10^{14}$ cm⁻³.

As seen from FIG. 4, the breakdown voltage VB increases in proportion to B. Then, using B as a parameter enables the breakdown voltage VB to be put on a specific curve without depending on the pitch d. From the result of the analysis, a decrease in the breakdown voltage is estimated. The value of B at which the breakdown voltage reaches the voltage equivalent to that of a conventional MOSFET with no buried layer is 0.3. Burying such U-shaped buried layers 8 as have a value equal to or larger than the value of B improves the breakdown voltage as compared with a case where no U-shaped buried layer is used.

When B is made equal to or larger than 0.5, the number of electrons trapped in the U-shaped buried layers 8 becomes the number of electrons necessary for electric field division, which saturates the breakdown voltage. Therefore, it is desirable that B should be 0.5 or more.

According to the second embodiment, a MOSFET with a lower on-resistance than that of a conventional equivalent can be made easily.

(Third Embodiment)

When U-shaped buried layers 8 are buried, the on-resistance and breakdown voltage are determined by the shape of the U-shaped buried layers 8. A (=Hd/g) and B (=(W+H)/d) are determined by the height H, pitch d, spacing g, and width W of the U-shaped buried layers 8. The effect of the U-shaped buried layers 8 is achieved by optimizing these A and B.

Specifically, making A equal to or less than 13.2 enables the on-resistance to be made lower than that of a conventional MOSFET. Making B equal to or more than 0.3 enables the breakdown voltage to be made higher than that of the conventional MOSFET.

Satisfying the above two conditions improves the tradeoff between the on-resistance and the breakdown voltage. The Si limit of the on-resistance/breakdown voltage of a power MOSFET is expressed by the following equation:

$$R{\rm on} = 8.33 \times 10^{-9}\, {\rm VB}^{2.5}\, \Omega{\rm cm}^2 \quad (3)$$

where Ron is the on-resistance and VB is the breakdown voltage.

Figure 5:
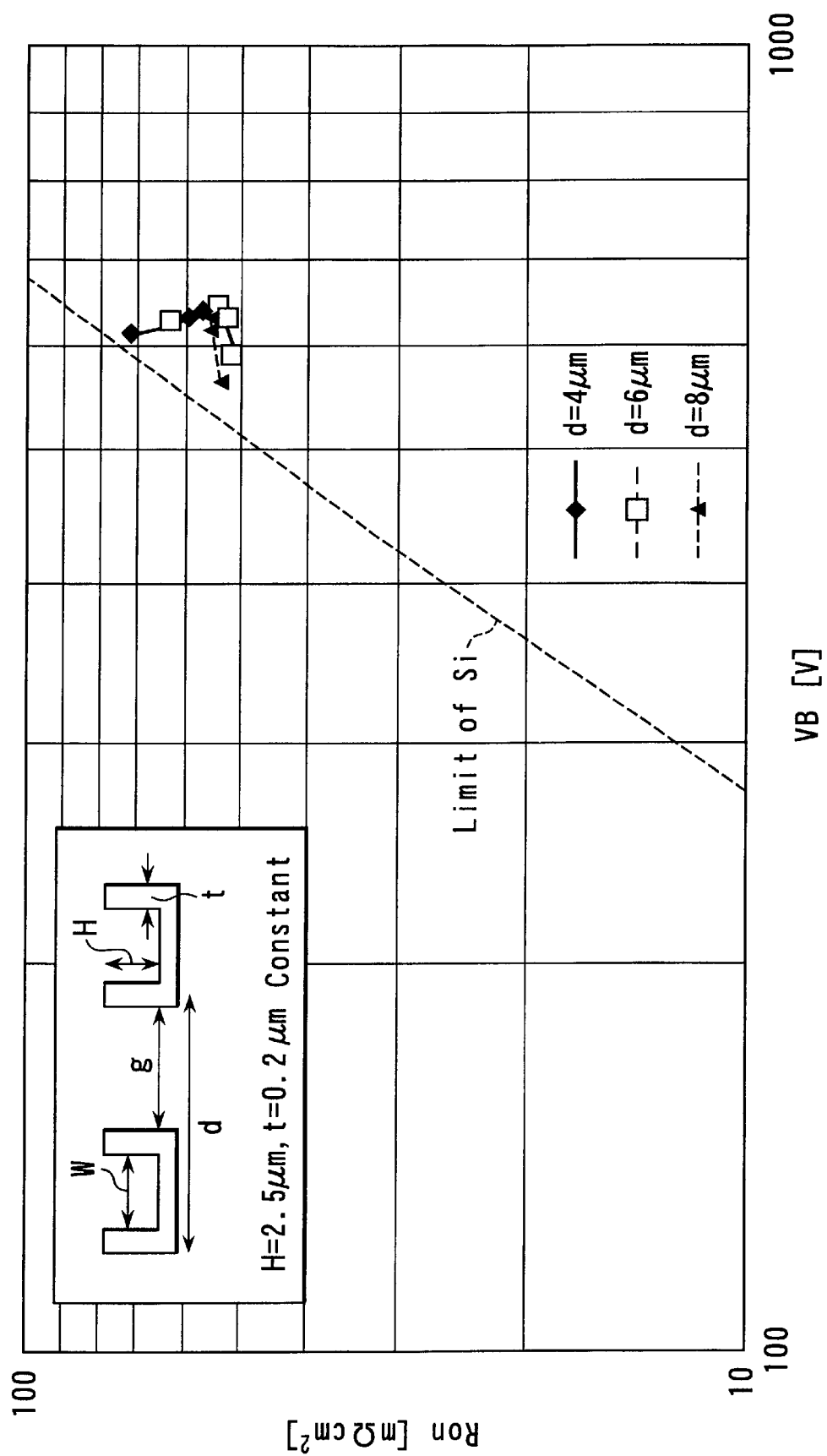
FIG. 5 is a characteristic diagram showing the relationship between the breakdown voltage and on-resistance of a vertical power MOSFET according to a third embodiment of the present invention.

FIG. 5 shows the result of the analysis of the tradeoff between the on-resistance and the breakdown voltage when a single layer of U-shaped buried layers is buried and the Si limit.

As apparent from FIG. 5, even when one layer is buried, the on-resistance drops below the Si limit at the element level. In this case, the range of each parameter is as follows: $2.5 \leq A \leq 4.5$ and $0.5 \leq B \leq 1$. When more than one layer of U-shaped buried layers 8 are buried, the on-resistance becomes much lower, which makes the range of the parameter wider.

According to the third embodiment, a MOSFET with a lower on-resistance than that of a conventional equivalent can be made easily.

Next, a method of manufacturing the buried layers 8 of FIG. 1 will be explained as a fourth embodiment of the present invention.

(Fourth Embodiment)

FIGS. 6A to 6D are sectional views showing stepwise a method of manufacturing a buried layer in a vertical power MOSFET according to a fourth embodiment of the present invention.

Figure 6A:
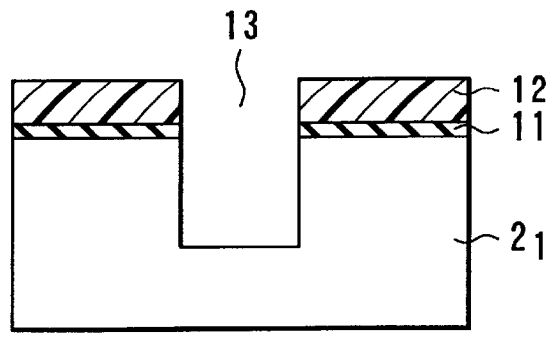
FIGS. 6A to 6D are sectional views showing stepwise a method of manufacturing a U-shaped buried layer in a vertical power MOSFET according to a fourth embodiment of the present invention.

First, as shown in FIG. 6A, a first-stage $n^-$ drift layer $2_1$ is formed by epitaxial growth on the top surface of an $n^+$ silicon substrate 1 (not shown). On the $n^-$ drift layer $2_1$, a first silicon oxide layer 11 is formed. After a resist 12 is applied to the first silicon oxide layer 11 and then dried, patterning is done by photolithographic techniques. With the patterned resist 12 as a mask, the first silicon oxide layer 11 is subjected to dry etching by RIE techniques. Then, using a stacked film of the resist pattern 12 and silicon oxide layer 11 as a mask, a trench 13 with a U-shaped cross section is made in the $n^-$ drift layer $2_1$ by anisotropic RIE techniques.

Figure 6B:
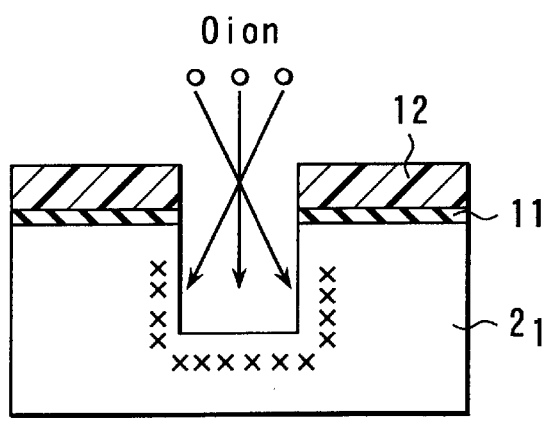
Figure 6C:
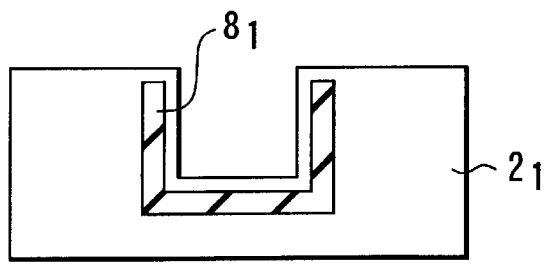

Then, as shown in FIG. 6B, after the resist pattern 12 is removed, oxygen is ion-implanted into the inside face of the trench 13 with the silicon oxide layer 11 as a mask. Thereafter, annealing is done, thereby making a U-shaped buried layer $8_1$ of the silicon oxide layer in the $n^-$ drift layer $2_1$ along the inside face of the trench 13. Then, the silicon oxide layer 11 is etched away.

Figure 6D:
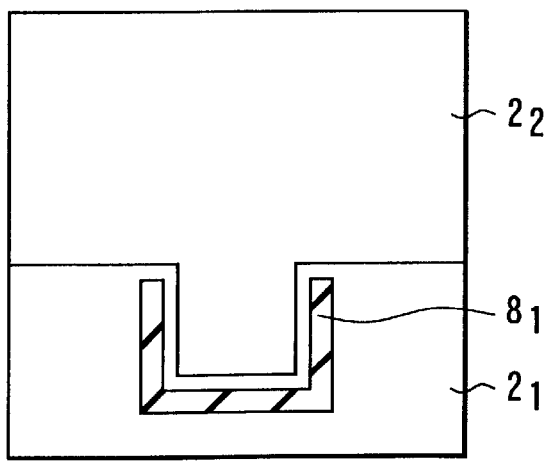

Next, as shown in FIG. 6D, a second-stage $n^-$ epitaxial layer $2_2$ is formed on the first-stage $n^-$ drift layer $2_1$ including the trench 13 by epitaxial growth. The surface of the $n^-$ epitaxial layer $2_2$ is flattened by CMP (chemical mechanical polishing) techniques, thereby forming not only the second-stage $n^-$ drift layer $2_2$ but also the first-stage buried layer $8_1$ having the $n^-$ silicon layer $2_2$ in the U-shaped buried layer.

As in the case of the first-stage buried layer $8_1$, a trench (13) with a U-shaped cross section is made at the surface of the second-stage $n^-$ drift layer $2_2$ through the processes in FIGS. 6A to 6D. Then, a U-shaped buried layer ($8_2$, not shown) of an oxide layer is formed along the inside face of the U-shaped trench (13) in the $n^-$ drift layer $2_2$. After the process of FIG. 6D, the processes of FIGS. 6A to 6D are carried out again, thereby completing the drift layer 2 including the buried layers $8_1$ to $8_3$ of FIG. 1. The processes of FIGS. 6A to 6D can be repeated a desired number of times (or n times, where n is an integer).

As in the basic configuration of FIG. 1, a $p^-$ well layer 3 is selectively formed by diffusion at the surface of the stacked-layer $n^-$ drift layer 2. Then, $n^+$ source layers 4 are selectively formed by diffusion at the surface of the $p^-$ well layer 3. A gate electrode 7 is formed via a gate insulating film 5 in the region ranging from the $p^-$ well layer 3 and $n^+$ source layers 4 to the $n^-$ drift layer 2 and to an adjacent p-well layer (3) (not shown). A source electrode 7 is formed through a contact hole in an insulating protective film 10 on the $p^-$ well layer 3 and $n^+$ source layers 4. Thereafter, a drain electrode 9 is formed on the bottom surface of the $n^+$ silicon substrate 1, which completes a vertical power MOSFET where the buried layers 8 are buried in the drift layer 2.

According to the manufacturing method of the fourth embodiment, the U-shaped buried layers 8 ($8_1$ to $8_3$) are formed in the $n^-$ drift layer 2 ($2_1$ to $2_3$) along the surfaces of the inner walls of the trenches 13 by oxygen ion implantation and annealing, preventing the surfaces of the oxide layers of the buried layers 8 from being exposed directly to high temperatures during the epitaxial growth of the upper $n^-$ drift layer 2, which enables the formation of buried layers of uniform thickness.

Each U-shaped buried layer 8 is formed so as to have a desirable U-shaped structure without any brim extending outward at the opening, which prevents the spacing between buried layers from getting narrower in the obtained power MOSFET and therefore makes the on-resistance lower.

While in the fourth embodiment, the U-shaped buried layer 8 has been made of a silicon oxide layer formed by oxygen ion implantation, it may be made of a nitride layer formed by nitrogen ion implantation.

(Fifth Embodiment)

Figure 7:
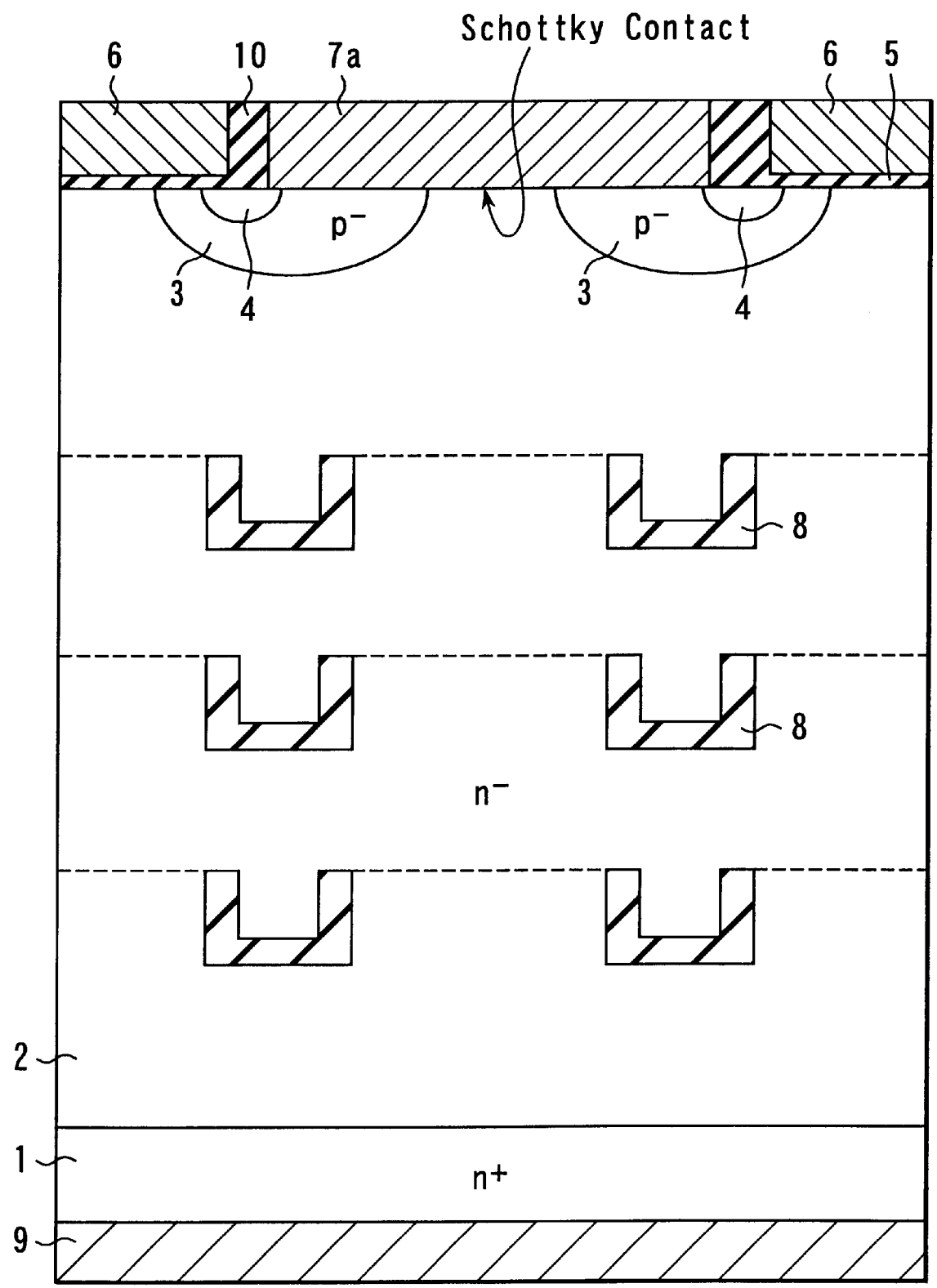
FIG. 7 is a sectional view of the element structure of a vertical power MOSFET according to a fifth embodiment of the present invention.

FIG. 7 is a sectional view of the element structure of a vertical power MOSFET according to a fifth embodiment of the present invention. On an $n^+$ silicon substrate 1, an $n^-$ drift layer 2 is formed. At the surface of the $n^-$ drift layer 2, $p^-$ well layers 3 are selectively formed. At the surface of each $p^-$ well layer 3, an $n^+$ source layer 4 is selectively formed. Above the $n^-$ source layer 4 and $n^-$ drift layer 2, a gate electrode 6 is formed via a gate insulating film 5. To the $n^+$ silicon substrate 1, a drain electrode 9 (first main electrode) is electrically connected. In the $n^-$ drift layer 2, a plurality of U-shaped buried layers 8 made of, for example, oxide layers, are provided vertically and horizontally in such a manner that they are arranged in three layers and each layer includes two of them, for example.

On the top of the $n^-$ drift layer 2, a source electrode 7a made of, for example, Mo is formed in such a manner that it contacts to the $p^-$ well layers 3 and $n^+$ source layers 4. In the fifth embodiment, the source electrode 7a is connected electrically to the $n^-$ drift layer 2 by Schottky contact. This makes a structure where a Schottky barrier diode (SBD) is connected in parallel with the p-n diode (the diode which the $p^-$ well layer 3 and $n^-$ drift layer 2 form) built in the power MOSFET. Since the high-speed SBD made low in resistance by the U-shaped buried layers 8 is connected in parallel with the power MOSFET, there is no need to externally connect a high-speed diode.

Since an ordinary SBD has a high on-resistance and a low breakdown voltage, it cannot be used for a high breakdown voltage MOS (for example, MOS with a breakdown voltage of 600 V). With the fifth embodiment, however, the formation of an SBD on the drift layer 2 whose concentration is made relatively high by the buried layers 8 makes the SBD have a higher breakdown voltage, which enables the SBD to function as a high-breakdown-voltage, high-speed diode.

(Sixth Embodiment)

Figure 8A:
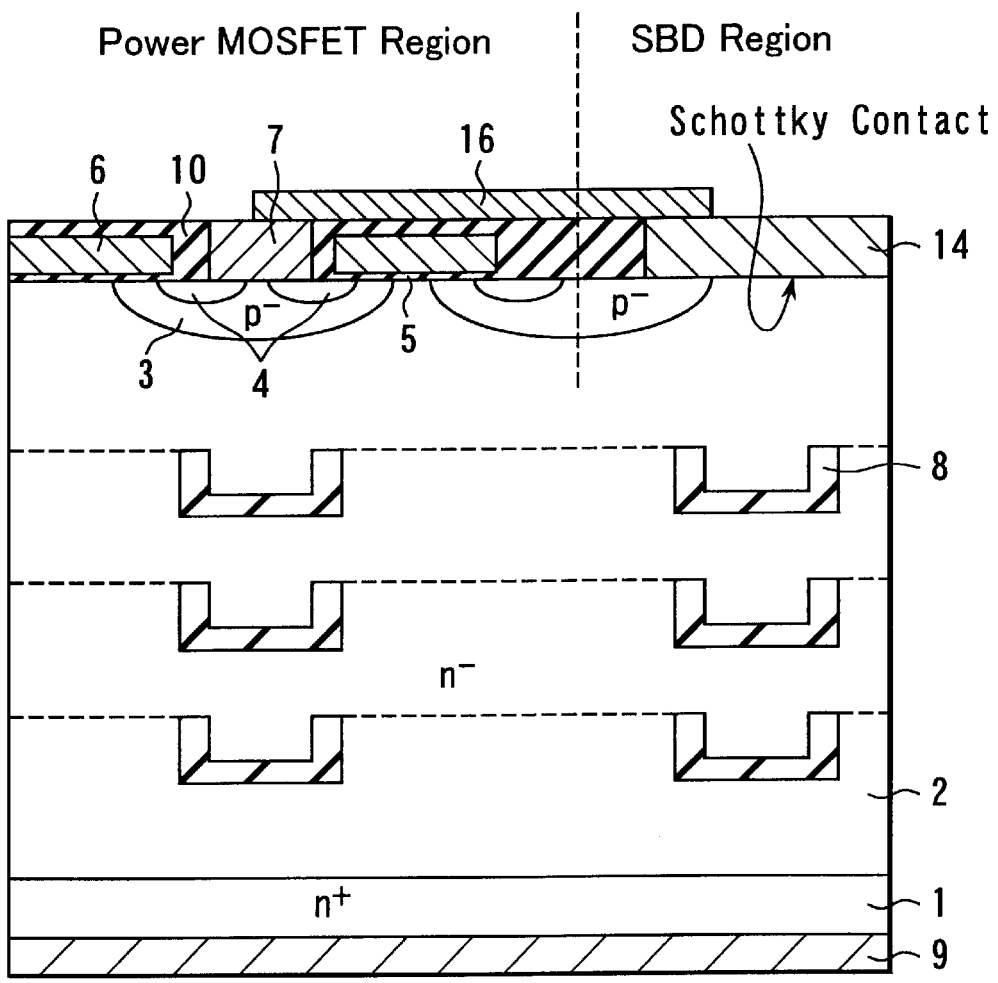
FIGS. 8A and 8B show the element structure of a vertical power MOSFET according to a sixth embodiment of the present invention, where
Figure 8B:
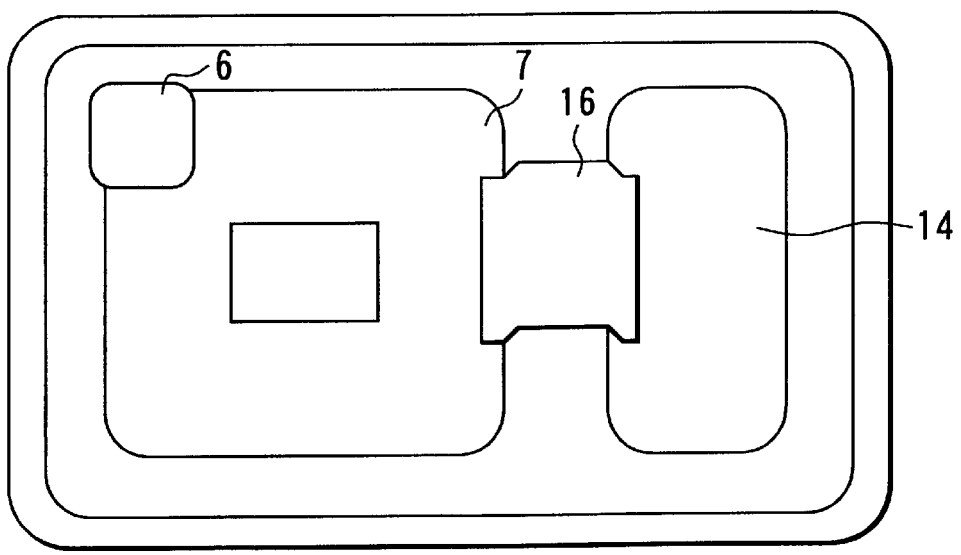

FIGS. 8A and 8B are a sectional view and plan view of the element structure of a vertical power MOSFET according to a sixth embodiment of the present invention, respectively. On an n+ silicon substrate 1, an n− drift layer 2 is formed. At the surface of the n− drift layer 2, p− well layer 3 are selectively formed. At the surface of the p− well layer 3, an n+ source layers 4 are formed. Above the n+ source layers 4 and n− drift layer 2, gate electrodes 6 are formed via a gate insulating film 5. In the n− drift layer 2, a plurality of U-shaped buried layers 8 made of, for example, oxide layers, are provided vertically and horizontally in such a manner that they are arranged in three layers and each layer includes two of them, for example. On the p− well layer 3 and n− source layers 4, a source electrode 7 (a second main electrode) is formed so as to extend over the two layers. A drain electrode 9 (a first main electrode) is connected electrically to the n+ silicon substrate 1.

In the sixth embodiment, a Schottky barrier diode (SBD) is connected in parallel with the p-n diode built in the power MOSFET as in the fifth embodiment. The sixth embodiment, however, differs from the fifth embodiment in that the region where the SBD is formed is provided on the n− drift layer 2 different from the region where the vertical power MOSFET is formed.

An anode electrode formed in the SBD region is connected electrically to the n− drift layer 2 by Schottky contact and further to the source electrode 7 via a wire 16. Forming the power MOSFET and SBD in separate regions this way enables the respective elements to be formed on a single chip in such a manner that each element has the optimum element area.

The power MOSFET and SBD separately formed may be connected with a metal film (interconnect) 16 formed by evaporation as shown in the figure or by wire bonding.

With the above configuration, a power semiconductor device is integrated in such a manner that a Schottky barrier diode is connected in parallel with its built-in diode, which enables a power semiconductor device featuring both a high breakdown voltage and high speed switching to be realized on a single chip.

It goes without saying that the Schottky barrier diode in each of the fifth and sixth embodiments may be combined with a power semiconductor device having the buried layers explained in the first to third embodiments.

In the fourth embodiment, the method of forming buried layers suitable for the case where a stacked n-type drift layer 2 is formed by epitaxial growth has been explained. In each of a seventh and an eighth embodiment of the present invention, another method of forming buried layers suitable for a case where a stacked n-type drift layer 2 is formed by epitaxial layer will be explained.

(Seventh Embodiment)

Figure 9:
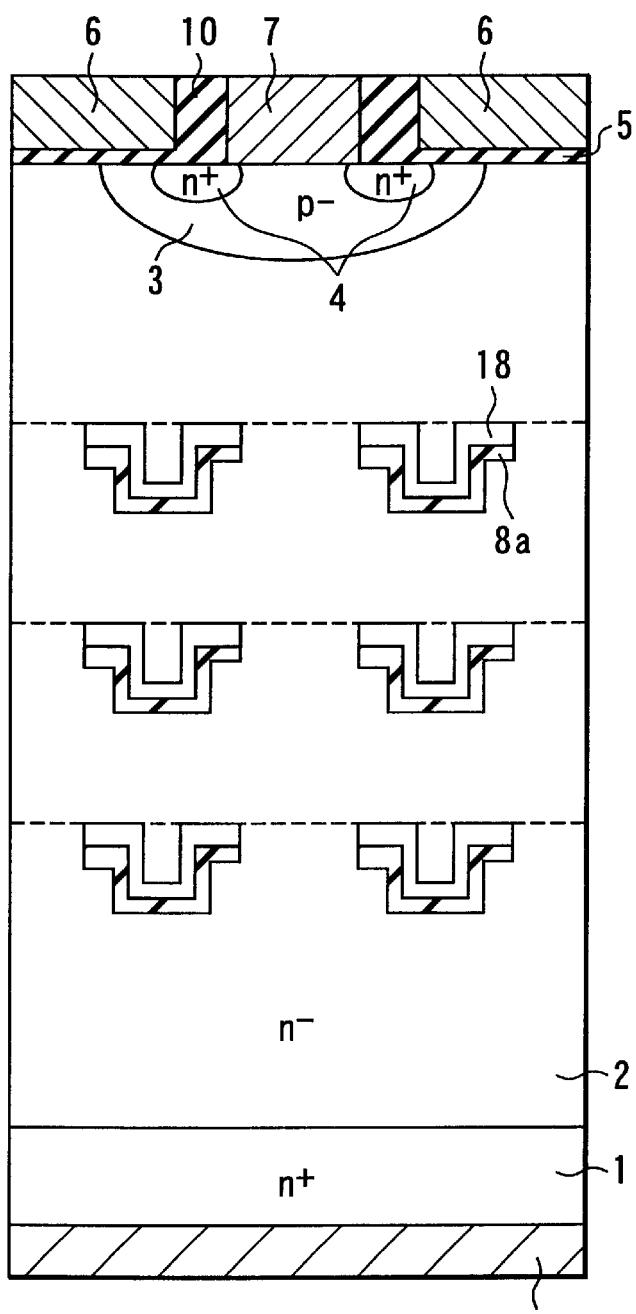
FIG. 9 is a sectional view of the element structure of a vertical power MOSFET according to a seventh embodiment of the present invention.

FIG. 9 is a sectional view of the element structure of a vertical power MOSFET according to a seventh embodiment of the present invention. The basic configuration of a vertical power MOSFET of the seventh embodiment is the same as that of FIG. 1 except for only the structure of the buried layers (indicated by 8a to discriminate the layers from those in FIG. 1).

Specifically, in the n− drift layer 2 (a monocrystalline layer), a plurality of U-shaped buried layers 8a made of, for example, oxide layers, are provided vertically and horizontally in such a manner that they are arranged in three layers and each layer includes two of them, for example. The top surface of the U-shaped buried layers 8a is covered with polysilicon 18. Although the polysilicon 18 exists in the n− drift layer 2 to which an electric field is applied when the element is off, this has no effect on the breakdown voltage, because it is the part where the electric field becomes the smallest. In addition, since the polysilicon 18 is connected electrically to the n− drift layer 2, it has no problem in terms of the operation of the element.

When the n− drift layer 2 is grown epitaxially to fill the buried layers 8a with semiconductor layers, a monocrystalline silicon grows from the top of the n− layer adjacent to each buried layer 8a and a polycrystallized silicon is deposited on the polysilicon 18. After a single crystal grown vertically from the n− layer has exceeded the buried layer 8a and the polycrystalline silicon grown on the buried layer 8a, the single crystal film extends horizontally, with the result that all the horizontal surface is covered with the monocrystalline film. Consequently, the thickness of the polysilicon on the buried layer 8a after the crystal growth reaches the total of the thickness of the polysilicon layer 18 deposited before crystal growth and the thickness of the polysilicon layer deposited during crystal growth. Since the polysilicon layer 18 deposited before crystal growth has only to cover the surface of the buried layer 8a completely, the thickness of the layer 18 has only to be about several tens of nanometers.

The thickness of the polysilicon layer deposited during crystal growth is about the thickness of the buried layer 8a. Therefore, the thickness of the resulting polysilicon layer 18 is larger than the thickness of the buried layer 8a.

Figure 10A:
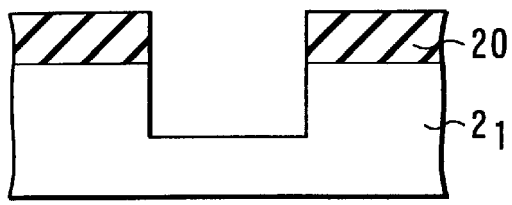
FIGS. 10A to 10E are sectional views showing stepwise a method of manufacturing a U-shaped buried layer in a vertical power MOSFET according to the seventh embodiment.
Figure 10B:
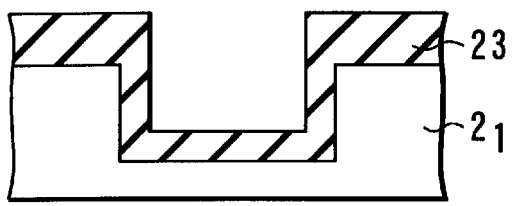

FIGS. 10A to 10E show stepwise a method of manufacturing a U-shaped buried layer 8a in the above-described vertical power MOSFET. First, in a stacked structure of a silicon oxide layer 20 and a silicon layer $2_1$ (part of the n− drift layer 2), a groove is made in the oxide layer 20 and n− drift layer $2^1$ by dry etching (FIG. 10A). Thereafter, an oxide layer 23, which is to become a buried layer 8a, is formed by thermal oxidation (FIG. 10B).

In this state, if an n− drift layer is grown epitaxially on the oxide layer 23, the oxide layer 23 is vaporized because of high temperatures during growth and oxygen annealing. Even if the original oxide film 23 is so thick that part of the oxide layer 23 remains after evaporation, the film thickness becomes nonuniform after burying.

Figure 10C:
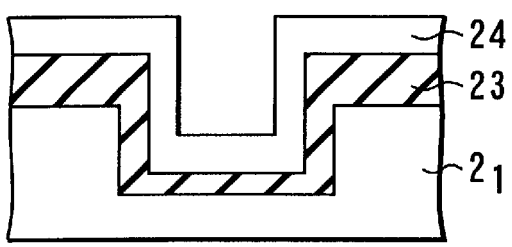
Figure 10D:
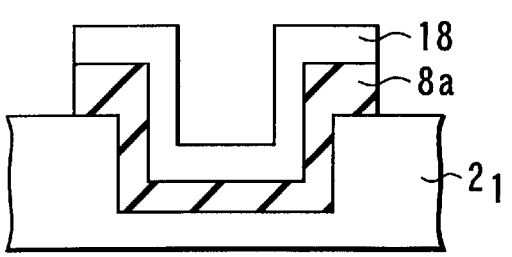
Figure 10E:
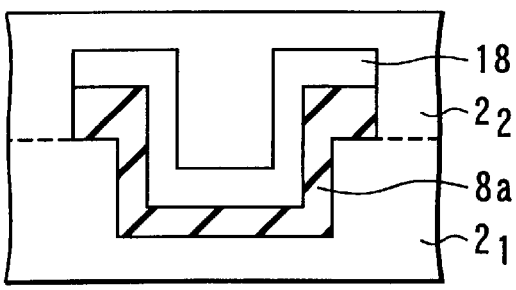

To overcome this problem, the oxide layer 23 is covered with a polysilicon layer 24 before epitaxial growth (FIG. 10C). Thereafter, the polysilicon layer 24 and oxide layer 23 are worked into specific dimensions by RIE and the like, forming the oxide layer 23 into a buried layer 8a and the polysilicon layer 24 into a polysilicon layer 18. In this case, to prevent the on-resistance from increasing, the brim of the buried layer 8a is so worked that it is minimized from the viewpoint of manufacturing techniques (FIG. 10D).

Then, an n− drift layer $2_2$ is grown epitaxially. The surface of the oxide layer 23 is covered with the polysilicon 18, which prevents the buried layer 8a from being exposed directly to high temperatures and enables the buried layer 8a of an oxide layer of uniform thickness to be buried even after the epitaxial growth.

The vertical MOSFET (FIG. 9) of the seventh embodiment may be combined with the Schottky barrier diode of FIG. 7 or FIGS. 8A and 8B.

(Eighth Embodiment)

Figure 11:
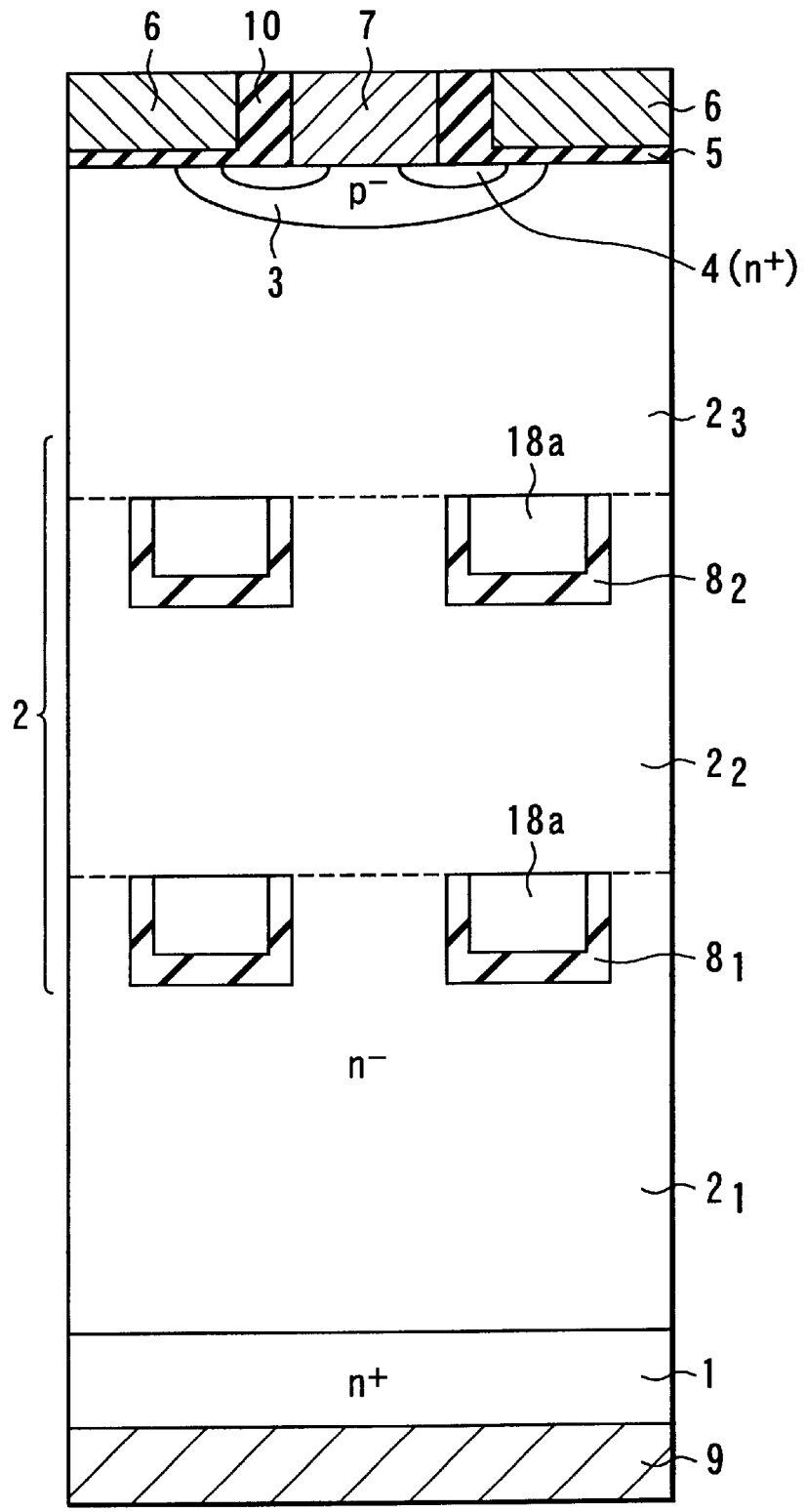
FIG. 11 is a sectional view of the element structure of a vertical power MOSFET according to an eighth embodiment of the present invention.

FIG. 11 is a sectional view of the element structure of a vertical power MOSFET according to an eighth embodiment of the present invention. On an n$^+$ silicon substrate 1 serving as a drain layer, a lower-stage n$^-$ drift layer $2_1$ is grown epitaxially. At the surface of the lower-stage n$^-$ drift layer $2_1$, a plurality of buried layers $8^1$ with a U-shaped cross section to trap carriers are formed at specific intervals in a striped pattern.

On the buried layers $8_1$, an intermediate-stage n$^-$ drift layer $2_2$ is formed in the same manner as the n$^-$ drift layer $2_1$. At the surface of the intermediate-stage n$^-$ drift layer $2_2$, a plurality of buried layers $8_2$ are formed at specific intervals in a striped pattern.

In this case, each of the U-shaped buried layers $8_1$ and $8_2$ is made of a silicon oxide film. In the U-shaped groove, a polysilicon layer 18a is buried. Each polysilicon layer 18a is connected electrically to each n$^-$ drift layer 2 ($2_1$–$2_3$). When a high voltage is applied, an accumulation layer is formed in the U-shaped groove, enabling carriers to be trapped. Both of the buried layers $8_1$ and $8_2$ are floating in the n$^-$ drift layer 2 in an electrically insulated manner.

Then, on the upper buried layer $8_2$, an upper-stage n$^-$ drift layer $2_3$ is formed. At the surface of the n$^-$ drift layer $2_3$, a p$^-$ well layer 3, n$^+$ source layers 4, a gate electrode 6, a source electrode 7, and others are formed.

In the power MOSFET with such a structure, when carriers are trapped in the buried layers $8_1$ and $8_2$, the n$^-$ drift layers $2_1$, $2_2$, $2_3$ divide the electric field in the n$^-$ drift layer 2. Therefore, raising the dopant concentration in the n$^-$ drift layer 2 enables a low on-resistance exceeding the limit to be realized, with the desired breakdown voltage remaining unchanged.

For instance, when two layers of U-shaped buried layers are provided in the vertical direction (or in the up-and-down direction on the figure), the dopant concentration in the n$^-$ drift layer 2 can be set to three times the dopant concentration of $2.5 \times 10^{14}$ cm$^{-3}$ in an ordinary vertical MOSFET, or to $7.5 \times 10^{14}$ cm$^{-3}$. When the film thickness of the buried layers $8_1$, $8_2$ is set to 0.2 $\mu$m, their width to 2.0 $\mu$m, their height to 2.5 $\mu$m, their lateral arrangement interval (pitch) to 6.0 $\mu$m, and their longitudinal pitch to 17.0 $\mu$m, the on-resistance can be made 40 m$\Omega \cdot$cm$^2$ exceeding the limits of silicon.

The amount of carriers accumulated in the buried layers $8_1$, $8_2$ an be controlled by changing the concentration in the polysilicon layer 18a in the U-shaped buried layers $8_1$, $8_2$ or the conductivity type of the polysilicon layer 18a. For instance, in a case where the dopant concentration in the polysilicon layer 18a is made equal to or lower than that in the n$^-$ drift layer 2, when a depletion layer has reached from the p$^-$ well layer 3 to the buried layers $8_1$, $8_2$, the polysilicon layer 18a is fully depleted, facilitating the formation of an accumulation layer, which increases the number of carriers to be trapped. Conversely, when the dopant concentration in the polysilicon layer 18a is made higher than that in the n$^-$ drift layer 2, the potential of the polysilicon layer 18a in the U-shaped groove drops, making it easier for electrons to flow into, which makes it easier to trap carriers.

Furthermore, when the conductivity type of the polysilicon layer 18a is made the p type different from that of the n$^-$ drift layer 2, the potential of the polysilicon layer 18a rises, making it more difficult for the carriers trapped in the accumulation layer to escape to the n$^-$ drift layer 2. As a result, the number of carriers trapped in the buried layers $8_1$, $8_2$ increases, which improves the breakdown voltage and lowers the on-resistance. Since the number of carriers to be trapped can be controlled, it is easy to obtain a given breakdown voltage and on-resistance.

While in the embodiment, the number of buried layers is two, use of a single layer enables the on-resistance to be made lower and exceed the limits of silicon. As the number of layers is increased, the dopant concentration in the n$^-$ drift layer 2 increases and the on-resistance decreases.

While in the eighth embodiment, the buried layer in each layer is arranged in such a manner that they are aligned in a vertical direction in which the source electrode is opposed to the drain electrode, they may not be aligned in the vertical direction, causing no problem in operation. Furthermore, the buried layers do not necessarily have a specific vertical relationship with the top MOS structure.

The plane structure of buried layers 8 (81, 82) may be shaped into a striped pattern, a zigzag pattern, or a grid pattern. When the plane structure is shaped into a striped pattern, buried layers are provided in a guard ring pattern at the edge termination region as described later. In this case, since the element region differs from the edge termination region, vertical alignment is needed to some extent. When the buried layers are arranged in a zigzag pattern or a grid pattern, there is no need to align them vertically, which makes it unnecessary to make alignment in each layer in the process of forming the buried layers 8.

Next, a method of manufacturing the vertical power MOSFET will be explained by reference to FIGS. 12A to 12F.

Figure 12A:
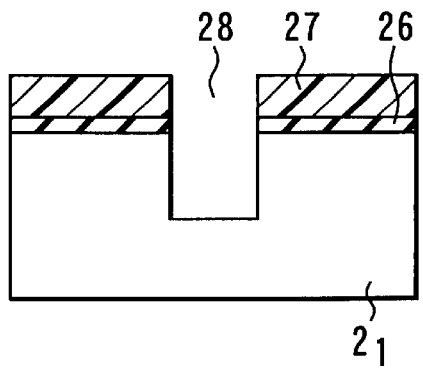
FIGS. 12A to 12F are sectional views showing stepwise a method of manufacturing a U-shaped buried layer in a vertical power MOSFET according to the eighth embodiment.

First, as shown in FIG. 12A, on the top surface of an n$^+$ silicon substrate (1) (not shown), a lower-stage n$^-$ drift layer $2^1$ is grown epitaxially. On the n$^-$ drift layer $2_1$, a first silicon oxide layer is formed. After a resist is applied to the silicon oxide layer and then dried, a resist pattern 27 is formed by lithographic techniques.

Using the resist pattern 27 as a mask, the first silicon oxide layer is dry-etched by RIE (Reactive Ion Etching) techniques, thereby patterning the first silicon oxide layer. Then, with a stacked layer of the resist pattern 27 and silicon oxide layer pattern 26 as a mask, a groove (hereinafter, referred to as a trench) 28 with a U-shaped cross section is made by RIE techniques.

Figure 12B:
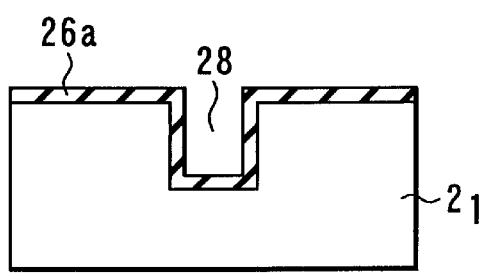

Next, after the resist pattern 27 and silicon oxide layer pattern 26 are removed, an oxide layer 26a to finally become a buried layer is formed by thermal oxidation at the surface of the n$^{31}$ drift layer $2_1$ including the surface of the trench 28 as shown in FIG. 12B.

Figure 12C:
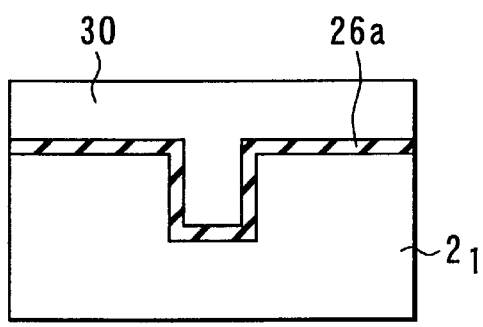

Then, as shown in FIG. 12C, a polysilicon layer 30 is deposited by CVD (Chemical Vapor Deposition) techniques on the n$^{31}$ drift layer $2_1$ including the trench 28 in such a manner that the polysilicon layer 30 is embedded in the trench 28.

Figure 12D:
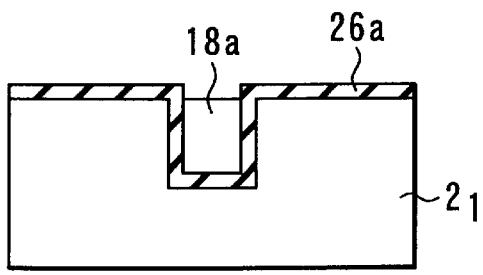
Figure 12E:
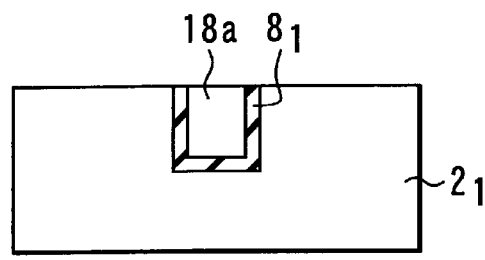

Then, as shown in FIG. 12D, the polysilicon layer 30 is retracted by etch-back techniques so that the surface of the polysilicon layer 30 in the trench 28 may be flush with the n$^{31}$ drift layer $2_1$ to form a polysilicon layer 18a. Thereafter, as shown in FIG. 12E, the oxide layer 26a on the n$^{31}$ drift layer $2_1$ is removed by CMP (Chemical Mechanical Polishing) techniques, with the result that a lower buried layer $8_1$ where the polysilicon layer 18a is embedded in the U-shaped groove is formed at the surface of the lower-stage n$^{31}$ drift layer $2_1$.

Figure 12F:
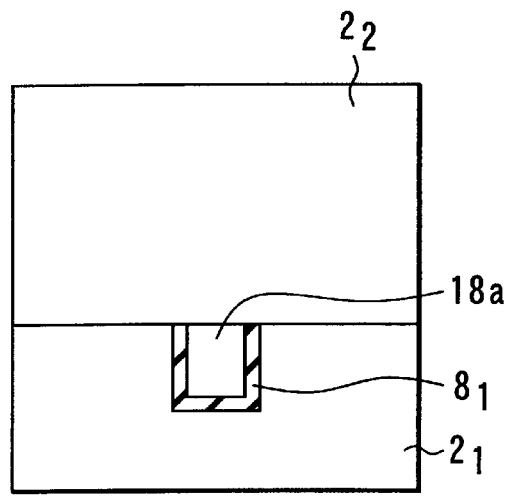

Then, as shown in FIG. 12F, an intermediate-stage n$^{31}$ drift layer $2_2$ is formed epitaxially on the n$^{31}$ drift layer $2_1$ including the lower buried layer $8_1$.

The surface of the intermediate-stage n$^{31}$ drift layer $2_2$ is subjected to the processes of FIGS. 12A to 12F as is the lower-stage n$^{31}$ drift layer, thereby forming the intermediate-stage n$^{31}$ drift layer $2_2$, upper-stage n$^{31}$ drift layer $2_3$, and intermediate-stage buried layer $8_2$ shown in FIG. 11. While in FIG. 11, the number of buried layers is two, the desired number of buried layers may be used. For instance, three or more layers may be used.

Thereafter, although not shown, as in the fifth embodiment (FIG. 5), a p⁻ well layer 3, n⁺ source layers 4, a gate insulating film 5, gate electrodes 6, and a source electrode 7 are formed at the surface of the upper-stage $n^{31}$ drift layer $2_3$. On the bottom surface of the n⁺ silicon substrate 1, a drain electrode 9 is formed, which completes a vertical power MOSFET with the configuration of FIG. 11.

In the manufacturing method of the eighth embodiment, after the polysilicon 18a is buried in the U-shaped buried layers $8_1$, $8_2$, the $n^{31}$ drift layers $2_2$, $2_3$ are grown epitaxially, which prevents the surface of the oxide layers of the buried layers $8_1$, $8_2$ from being exposed directly to high temperatures and enables the formation of the buried layers $8_1$, $8_2$ of uniform thickness.

The U-shaped buried layer $8_1$, $8_2$ are formed by etching the oxide film 26a and polysilicon layer 30 formed on the $n^{31}$ drift layers $2_1$, $2_2$ including the trench 28 until the top surface of the $n^{31}$ drift layers $2_1$, $2_2$ has been exposed, in such a manner that the oxide layer 26a and polysilicon layer 30 are left only in the trench 28 and the remaining are removed. Consequently, the desirable U-shaped buried layers $8_1$, $8_2$ have no brim extending outward at the opening. Therefore, in the obtained power MOSFET, the on-resistance can be decreased without narrowing the spacing between buried layers.

Furthermore, since the epitaxial growth of the upper $n^{31}$ drift layers $2_2$, $2_3$ directly on the $n^{31}$ drift layer $2_1$, $2_2$ including the trench 28 makes the top surface of the upper $n^{31}$ drift layers $2_2$, $2_3$ uneven, a flattening process by CMP or the like is needed. In the eighth embodiment, however, the trench 28 is filled with the polysilicon layer 30, flattening the surface of the upper $n^{31}$ drift layers $2_2$, $2_3$ after epitaxial growth, which eliminates a flattening process by CMP or the like and decreases the number of manufacturing processes.

In the eighth embodiment, the etching of the polysilicon and the oxide layer of the buried layer may be effected by wet etching, dry etching, or CMP. While in FIGS. 12C to 12E, the polysilicon layer 30 and oxide layer 26a are etched separately, they may be etched continuously using the same etchant or etching gas. Although the insulating layer has been formed by thermal oxidation, a nitride layer may be formed by thermal nitriding. Alternatively, an insulating layer or a semiconductor layer with a wider bandgap may be deposited using CVD.

The vertical MOSFET (FIG. 11) of the eighth embodiment may be combined with the Schottky barrier diode of FIG. 7 or FIGS. 8A and 8B.

(Ninth Embodiment)

Figure 13:
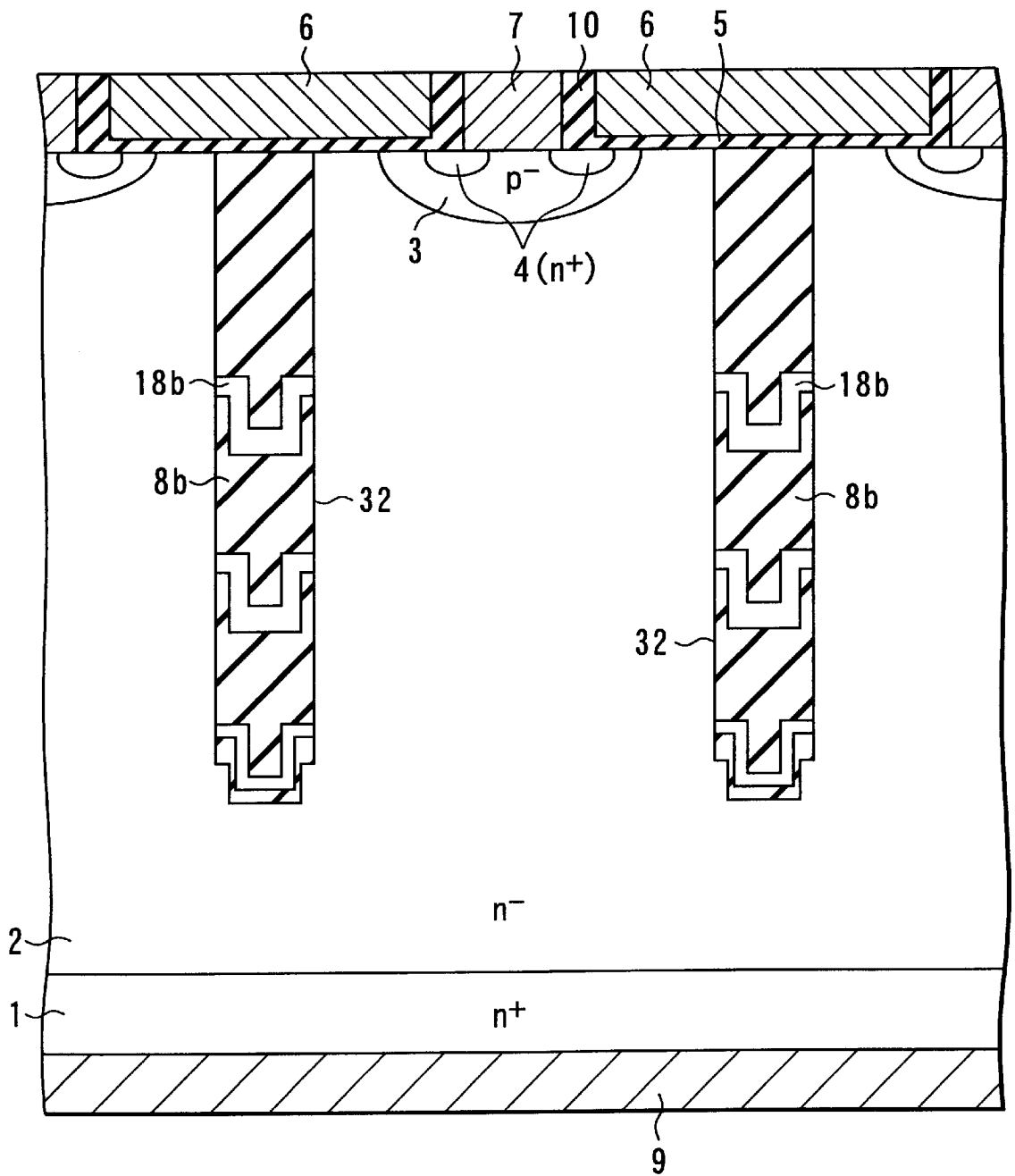
FIG. 13 is a sectional view of the element structure of a vertical power MOSFET according to a ninth embodiment of the present invention.

FIG. 13 is a sectional view of the element structure of a vertical power MOSFET according to a ninth embodiment of the present invention. Since the configuration of a MOSFET is the same as that of FIG. 1 or FIG. 9 except for the buried layers, repetitive explanation will be omitted and only the characteristic part will be explained.

In the $n^{31}$ drift layers 2 under the gate electrodes 6, trenches 32 are made. In each trench 32, a buried layer 8b made of a silicon oxide layer and a polysilicon layer 18b with a U-shaped cross section are buried alternately. The polysilicon layer 18b is connected electrically to the $n^{31}$ drift layers 2. The silicon oxide layer 8b to become a buried layer is also shaped like almost the letter U.

When the MOSFET is off, electrons flow from the n⁻ drift layer 2 to the polysilicon layer 18b and are trapped there, thereby dividing the electric field in the $n^{31}$ drift layer 2, which improves the breakdown voltage of the MOSFET. In this structure, since the trench is formed by depositing the oxide layer 8b and polysilicon layer 18b without performing epitaxial growth for burying, great cost reduction can be expected.

Figure 14A:
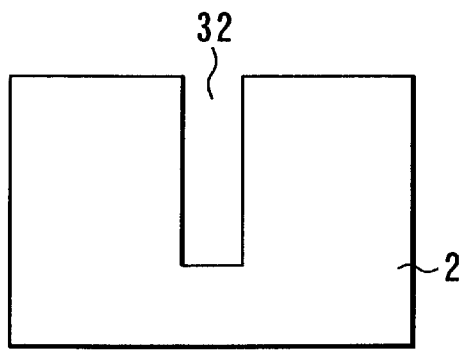
FIGS. 14A to 14G are sectional views showing stepwise a method of manufacturing a U-shaped buried layer in a vertical power MOSFET according to the ninth embodiment.
Figure 14E:
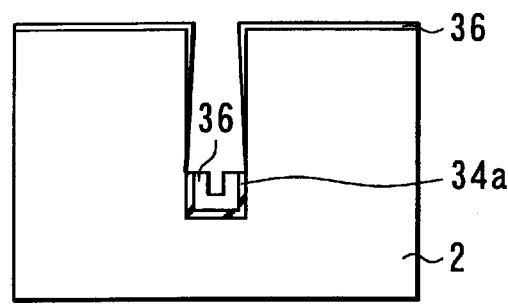
Figure 14B:
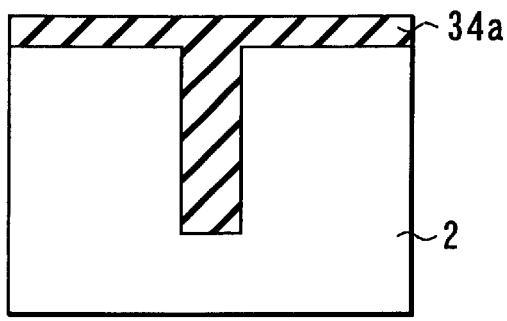

FIGS. 14A to 14G are sectional views showing stepwise the process of forming a buried layer in the vertical power MOSFET. First, the $n^{31}$ drift layer 2 is etched to such a thickness as is needed for the breakdown voltage of the MOSFET, thereby making a trench 32 (FIG. 14A). In the case of a MOSFET with a breakdown voltage of 600 V, the $n^{31}$ drift layers 2 is etched about 40 to 50 μm. Thereafter, the trench 32 is filled with a silicon oxide layer 34a (FIG. 14B).

Figure 14F:
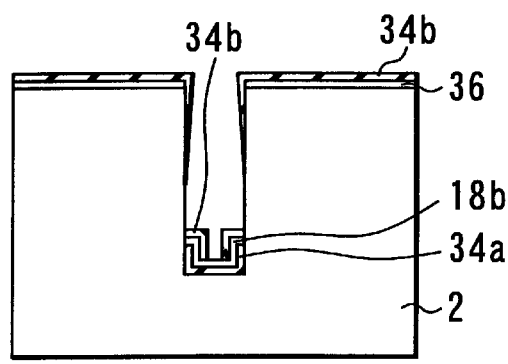
Figure 14C:
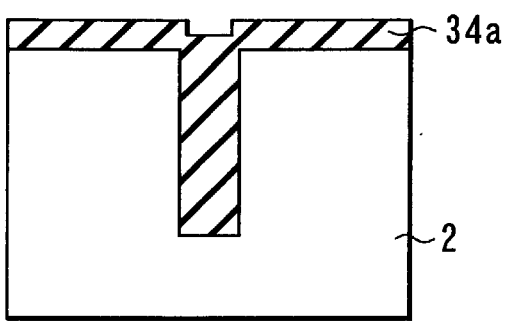

Thereafter, to make a U-shaped groove, the oxide layer 34a on the trench 32 is etched about 2 μm deep (FIG. 14C). Then, by dry etching, the oxide film 34a is etched back so as to leave a U-shaped oxide layer at the bottom (FIG. 14D). On the U-shaped oxide layer, a polysilicon layer 36 is deposited (FIG. 14E). At this time, the deposition rate is made faster to prevent much polysilicon from depositing on the sidewall of the trench 32.

Next, the deposited polysilicon layer 36 is thermally oxidized, thereby forming a thermal oxide layer 34b (FIG. 14F). At this time, although all the polysilicon deposited on the sidewall is oxidized, the polysilicon on the surface of the drift layer 2 and the bottom of the trench 32 are oxidized only at its surface, with the result that a U-shaped polysilicon layer 18a is formed at the bottom of the trench 32.

Figure 14G:
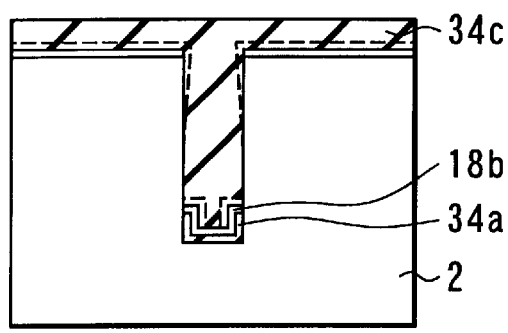
Figure 14D:
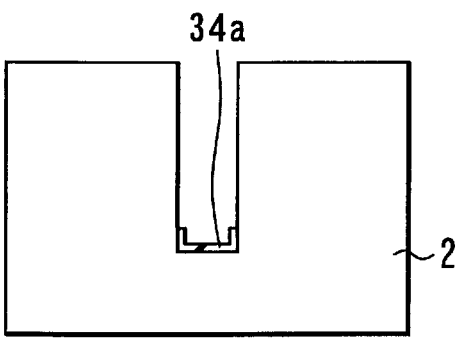

Thereafter, the trench 32 is filled with an oxide film 34c again (FIG. 14G). The processes of FIG. 14B and afterward are performed repeatedly on the oxide layer 34c, thereby forming a structure where multiple layers of U-shaped buried layers 8b are buried vertically. In this case, the thermal oxide layer 34b and the oxide layer 34c remaining after etching compose the buried layer 8b.

The vertical MOSFET (FIG. 13) of the ninth embodiment may be combined with the Schottky barrier diode of FIG. 7 or FIGS. 8A and 8B.

According to the seventh to ninth embodiments, a polycrystalline semiconductor is formed on the U-shaped buried insulating layers, preventing the surface of the buried insulating layers from being exposed directly to high temperatures, which enables the formation of the buried insulating layers of uniform thickness. Moreover, when the U-shaped buried layers are formed in such a manner that the insulating layer and polycrystalline semiconductor layer are left only in the trench made in the drift layer, it is easy to form U-shaped buried layers of a desired shape that have no brim extending outward at the opening. In addition, the U-shaped insulating layer is filled completely with a polycrystalline semiconductor, the surface of the upper drift layer epitaxially grown on the resulting layer is flat, eliminating the flattening process, which decreases the number of manufacturing steps.

Next, a buried layer 8 having a shape with an improved charge trap performance will be explained as a tenth embodiment of the present invention.

(Tenth Embodiment)

Figure 15:
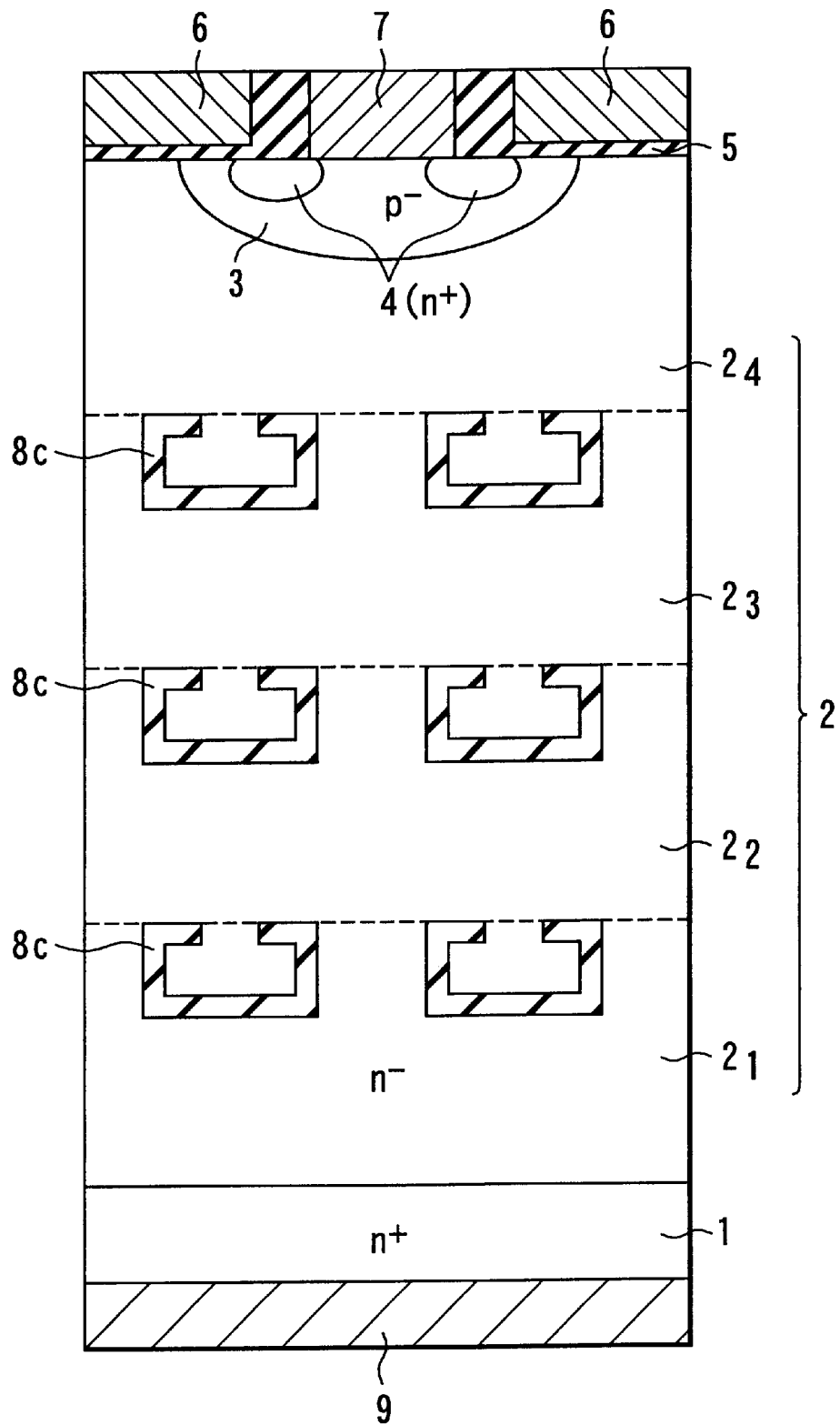
FIG. 15 is a sectional view of the element structure of a vertical power MOSFET according to a tenth embodiment of the present invention.

FIG. 15 is a sectional view of the element structure of a vertical power MOSFET according to a tenth embodiment of the present invention. Since the element structure of the tenth embodiment is basically the same as that of FIG. 1 or FIG. 9 except for the shape of the buried layers 8, only the difference between them will be explained and repetitive explanation for omitted.

In an $n^{31}$ drift layer 2, a plurality of U-shaped buried layers 8c with a narrowed opening made of, for example, a silicon oxide layer are buried in such a manner that two or more of the buried layers, for example, tow buried layers, are arranged in a horizontal direction perpendicular to a vertical direction connecting a source electrode 7 and a drain electrode 9, and three layers of the set of two buried layers are arranged in the vertical direction.

In the structure of FIG. 15, since three rows of U-shaped buried layers 8 are buried, the electric field is divided into four parts. As a result, the breakdown voltage necessary for the divided U-shaped buried layers 8c is 1/4 of the whole breakdown voltage.

The U-shaped buried layer 8 has a thickness of 0.2 µm, a width of 3 µm, a height of 2 µm, a horizontal pitch of 6 µm, and a vertical spacing of 14 µm. The U-shaped buried layer 8 whose top end protrudes inward is characterized in that the width of its opening is narrower than the width of its bottom.

Figure 16:
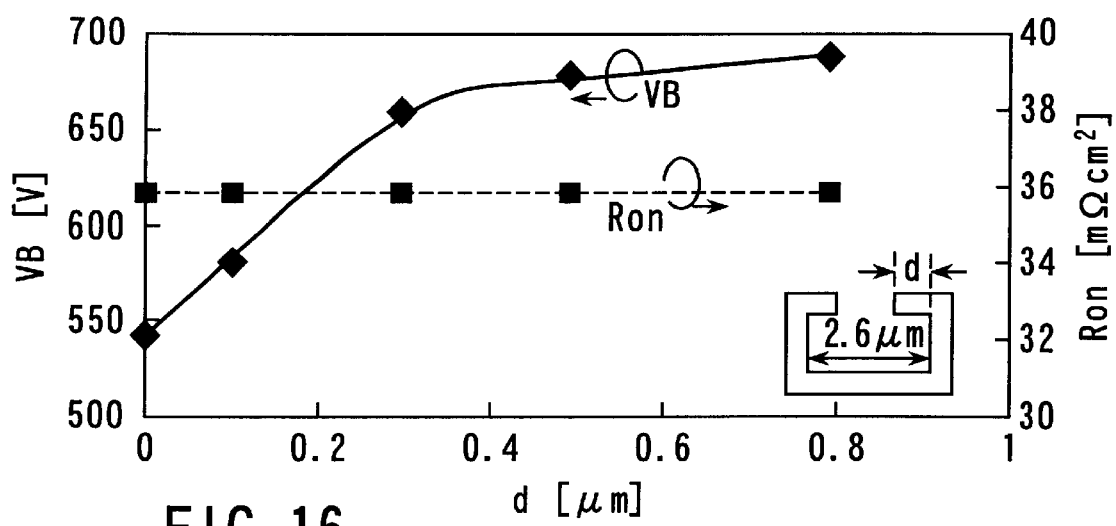
FIG. 16 is a characteristic diagram showing the relationship between the amount of inward protrusion of the opening of a U-shaped buried layer and its breakdown voltage in the tenth embodiment.

FIG. 16 shows the relationship between the breakdown voltage VB and on-resistance Ron for the length d of the protruding top end in the U-shaped buried layer 8c. As the length d of the protrusion increases, the number of electrons trapped increases, as of the case where the height of the buried layer is increased, improving the breakdown voltage VB. Since the current path does not change, depending on whether the protrusion is present or not, the on-resistance Ron does not change. A protrusion of 0.3 µm or more improves the breakdown voltage by 100 V or more. Since the time required to trap carriers is short, the switching characteristic does not change, even when the width of the opening becomes small.

FIGS. 17A to 17D show stepwise the process of forming a U-shaped buried layer 8c in the vertical power MOSFET.

Figure 17A:
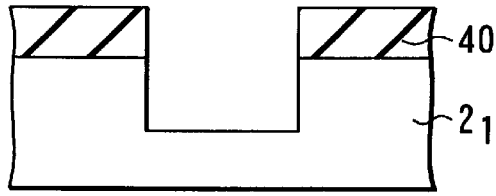
FIGS. 17A to 17D are sectional views showing stepwise a method of manufacturing a U-shaped buried layer in a vertical power MOSFET according to the tenth embodiment.
Figure 17B:
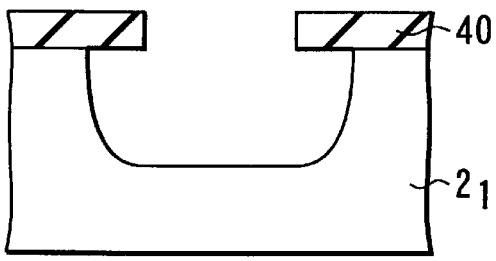

First, a groove is made in a first silicon oxide layer 40 and a lower-stage drift layer $2_1$ by dry etching (FIG. 17A). Using the first silicon oxide layer 40 as a mask, the drift layer $2_1$ is etched by wet etching (isotropic etching) (FIG. 17B).

Figure 17C:
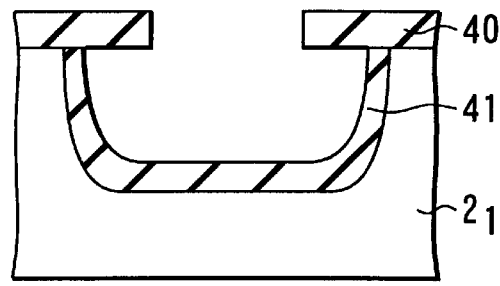
Figure 17D:
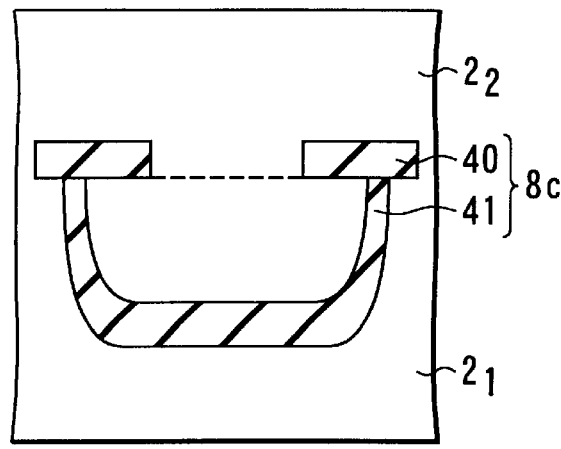

Next, a second silicon oxide layer 41 is formed by thermal oxidation (FIG. 17C). The oxide layer 40 is cut in such a manner that the outward extending part of the groove in the first silicon oxide layer 40 becomes as small as possible from the viewpoint of fabrication. Then, an intermediate-stage drift layer $2_2$ is grown so as to fill the oxide layer 40 (for example, by CVD), thereby forming a structure where a U-shaped buried layer 18c whose opening at its top is narrowed is buried in the drift layer 2 (FIG. 17D).

According to the tenth embodiment, the area of the top opening in the U-shaped buried layer buried in the drift layer is made smaller, thereby preventing trapped carriers from escaping, which enables the breakdown voltage to be improved with the low on-resistance.

Next, embodiments related to the shape or arrangement of buried layers taking into account not only the element region (or MOSFET region) where an active region of the vertical power MOSFET is formed but also the edge termination region enclosing the MOSFET region will be explained as the following eleventh to seventeenth embodiments.

(Eleventh Embodiment)

Figure 18:
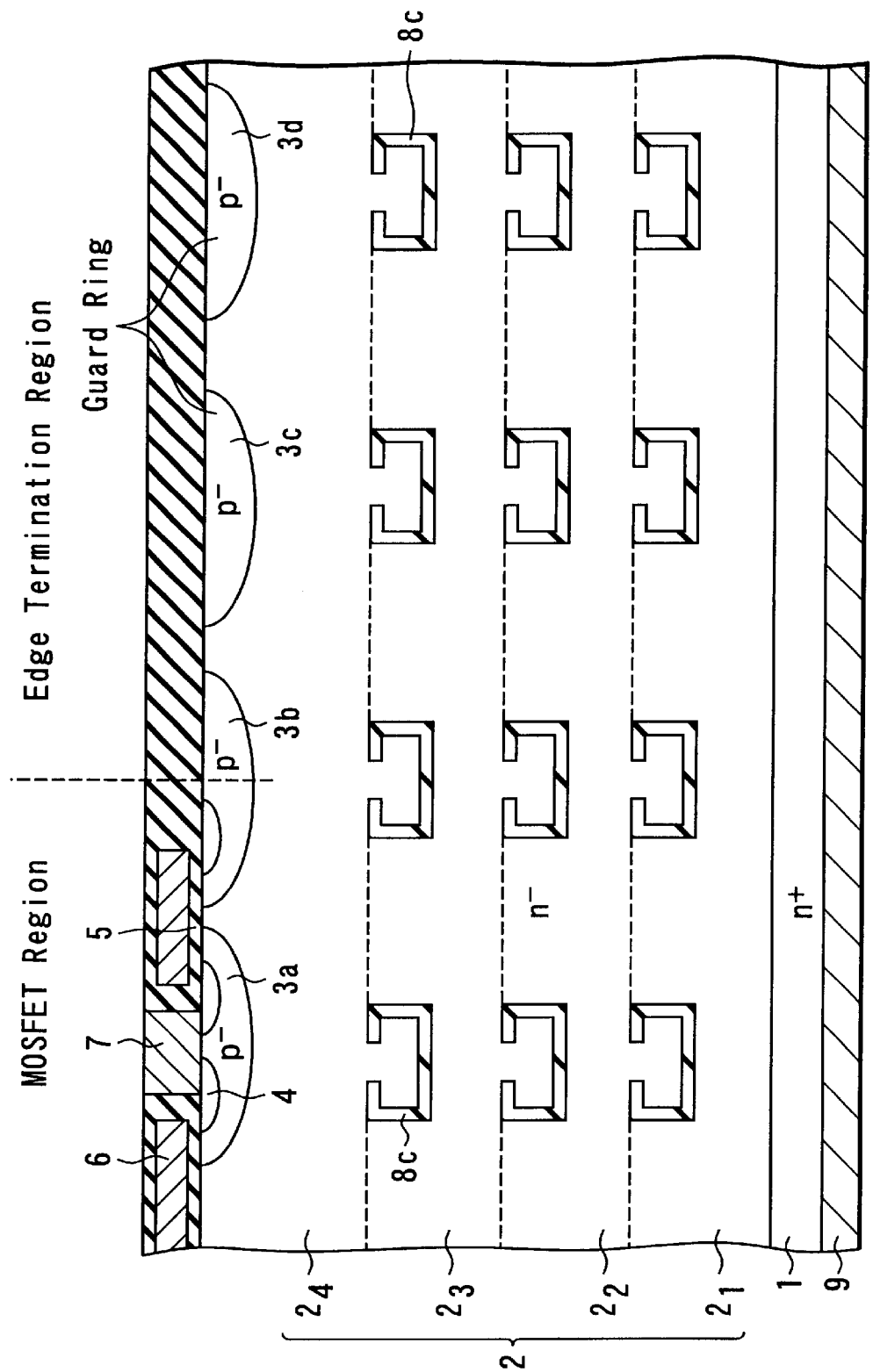
FIG. 18 is a sectional view of the element structure of a vertical power MOSFET according to an eleventh embodiment of the present invention.

FIG. 18 is a sectional view of the element structure of a vertical power MOSFET according to an eleventh embodiment of the present invention. Since the configuration of the MOSFET region at left of FIG. 18 is basically the same as that of FIG. 15 except that p⁻ well layer 11 is indicated by reference numeral 3a.

In the eleventh embodiment, not only in the MOSFET region where a power MOSFET is formed but also in the edge termination region, U-shaped buried layers 8c made of a silicon oxide layer whose opening is made narrower as in the MOSFET region are buried. The right half region of FIG. 11 is the edge termination region. At the surface of the $n^{31}$ drift layer 2 in the element edge termination region, $p^{31}$ well layers 3b, 3c, 3d are formed as a guard ring. In the $n^{31}$ drift layer 2 under the $p^{31}$ well layers, a plurality of U-shaped buried layers 8c whose opening is narrowed are buried.

Since the direction of the electric field inclines in the edge termination region, carriers are less easy to trap. Narrowing the opening decreases the scattering of carriers. This enables the electric field in the $n^{31}$ drift layer to be divided even in the edge termination region, which prevents the breakdown voltage from dropping in the edge termination region.

The U-shaped buried layers 8c are aligned vertically in the figure. As long as the U-shaped buried layers are buried in a plane in a uniform density, they may not be aligned vertically because the breakdown voltage is theoretically maintained.

(Twelfth Embodiment)

Figure 19A:
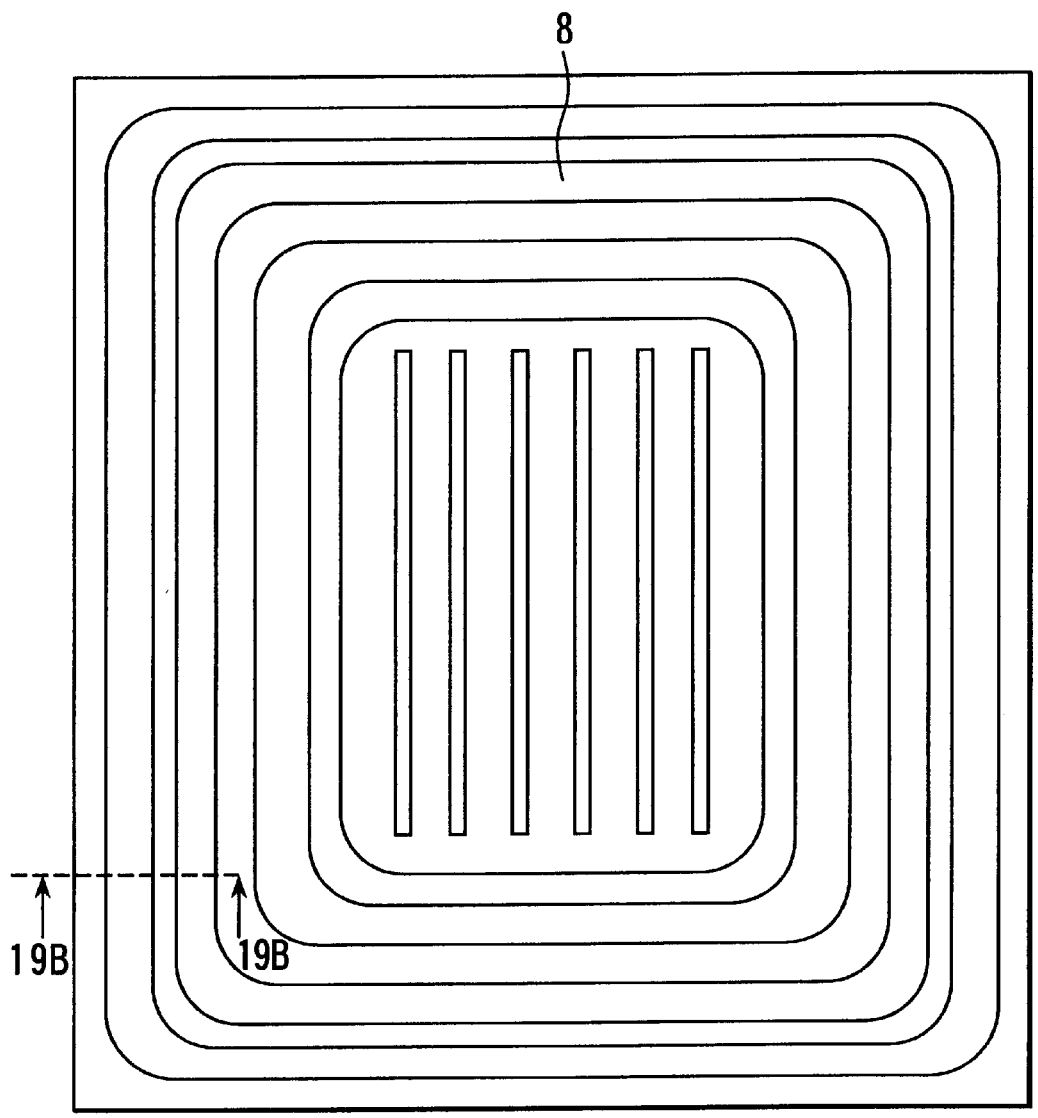
FIG. 19A shows a plane pattern of U-shaped insulators formed in a vertical power MOSFET according to a twelfth embodiment of the present invention.

FIG. 19A shows a plane pattern of U-shaped buried layers according to a twelfth embodiment of the present invention. The buried layers 8 are arranged in a striped pattern in the element region (or MOSFET region). They are arranged in a concentric pattern in the edge termination region as in a guard ring. The pitch of buried layers 8 is 6 µm and their width is 3 µm. The pitch and width are the same in both the MOSFET region and the edge termination region. To maintain the breakdown voltage, the buried layers 8 may be arranged at narrower intervals in the edge termination region. While in FIG. 19A, the buried layers are connected to such a ring as goes around the periphery to cause all the stripes to have the same potential, they may not be connected to such a ring. The buried layers 8 may be arranged in a mesh pattern.

Figure 19B:
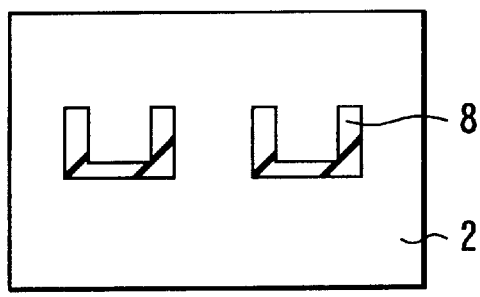
FIG. 19B is a sectional view taken along line 19B—19B of FIG. 19A.

FIG. 19B is a sectional view taken along line 19B—19B of FIG. 19A, where U-shaped buried layers 8 are buried in the drift layer 2.

In the twelfth embodiment, when multiple layers of U-shaped buried layers are arranged in the $n^{31}$ drift layer, a concentric pattern of buried layers 8 is formed in the edge termination region of each layer. Therefore, to maintain the breakdown voltage, the buried layers 8 have to be aligned vertically. The accuracy of the alignment has to be about 10 µm equivalent to one or two guard rings in the edge termination region.

(Thirteenth Embodiment)

Figure 20A:
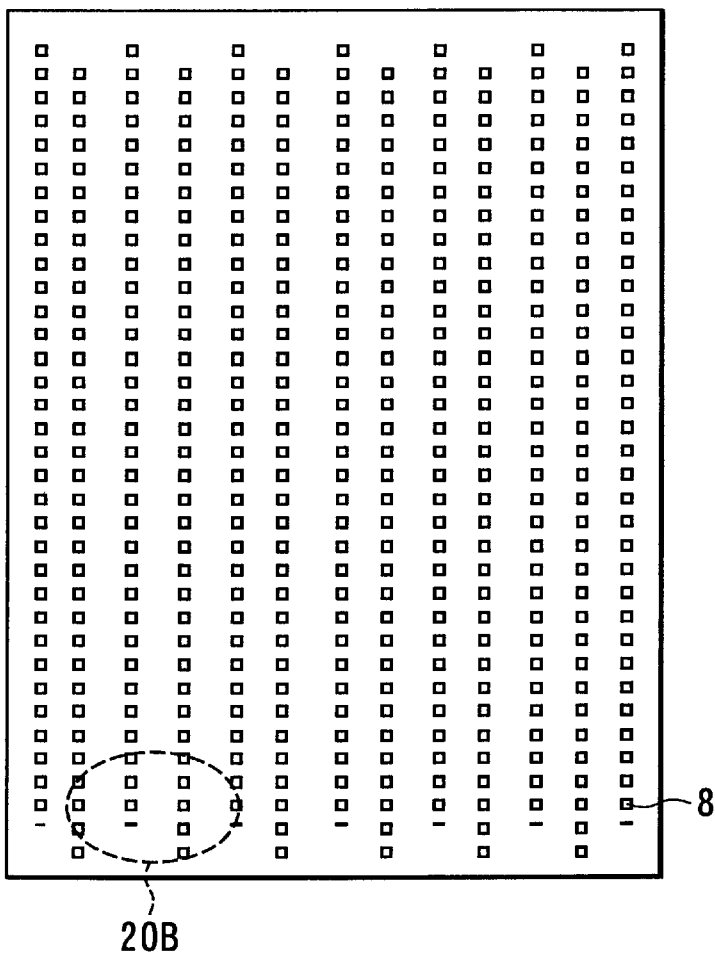
FIG. 20A shows a plane pattern of U-shaped insulators formed in a vertical power MOSFET according to a thirteenth embodiment of the present invention.
Figure 20C:
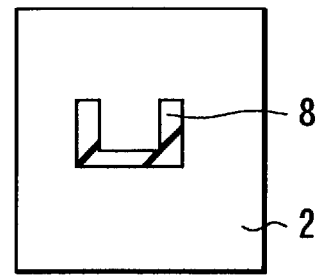
FIG. 20C is a sectional view taken along line 20C—20C of FIG. 20B.
Figure 20B:
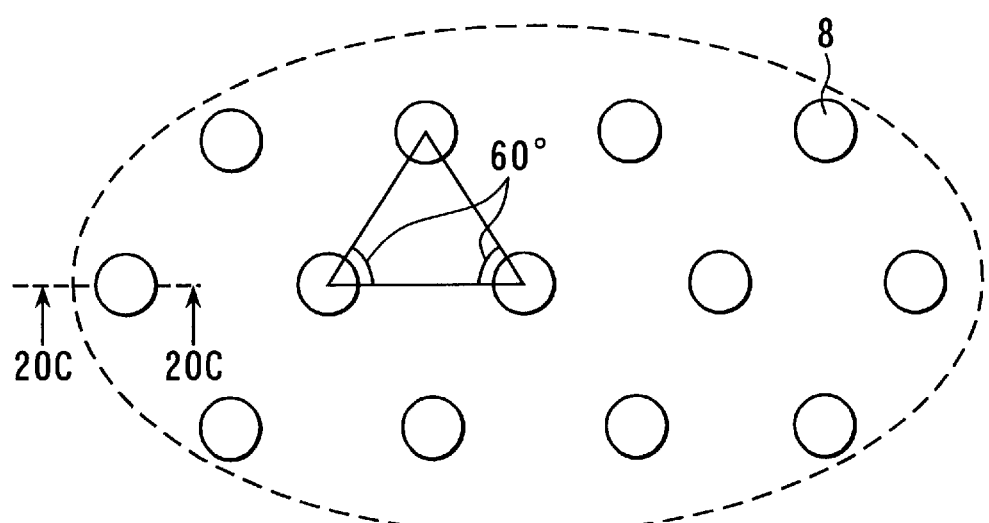
FIG. 20B is an enlarged view of the part indicated by 20B in FIG. 20A.

FIG. 20A shows a plane pattern of U-shaped buried layers according to a thirteenth embodiment of the present invention. The buried layers 8 are arranged in a zigzag pattern as a whole. The pitch of buried layers is 6 µm and their diameter is 3 µm. FIG. 20B is a partially enlarged plan view. FIG. 20C is a sectional view taken along line 20C—20C of FIG. 20B. In FIG. 20C, a buried layer 8 is buried in the drift layer 2.

To maintain the breakdown voltage, the spacing between buried layers may be narrowed in only the edge termination region. The buried layers 8 may be arranged in a grid pattern.

In the thirteenth embodiment, when multiple layers of buried layers are formed in the drift layer 2, a concentric pattern of buried layers 8 is not formed in each layer. Therefore, the buried layers 8 need not be aligned vertically to maintain the breakdown voltage. Furthermore, since the area of the buried layers 8 becomes smaller, the on-resistance of the MOSFET decreases.

Next, embodiments where the shape or arrangement of buried layers is changed in the MOSFET region and the edge termination region will be explained as a fourteenth to a sixteenth embodiment.

(Fourteenth Embodiment)

Figure 21:
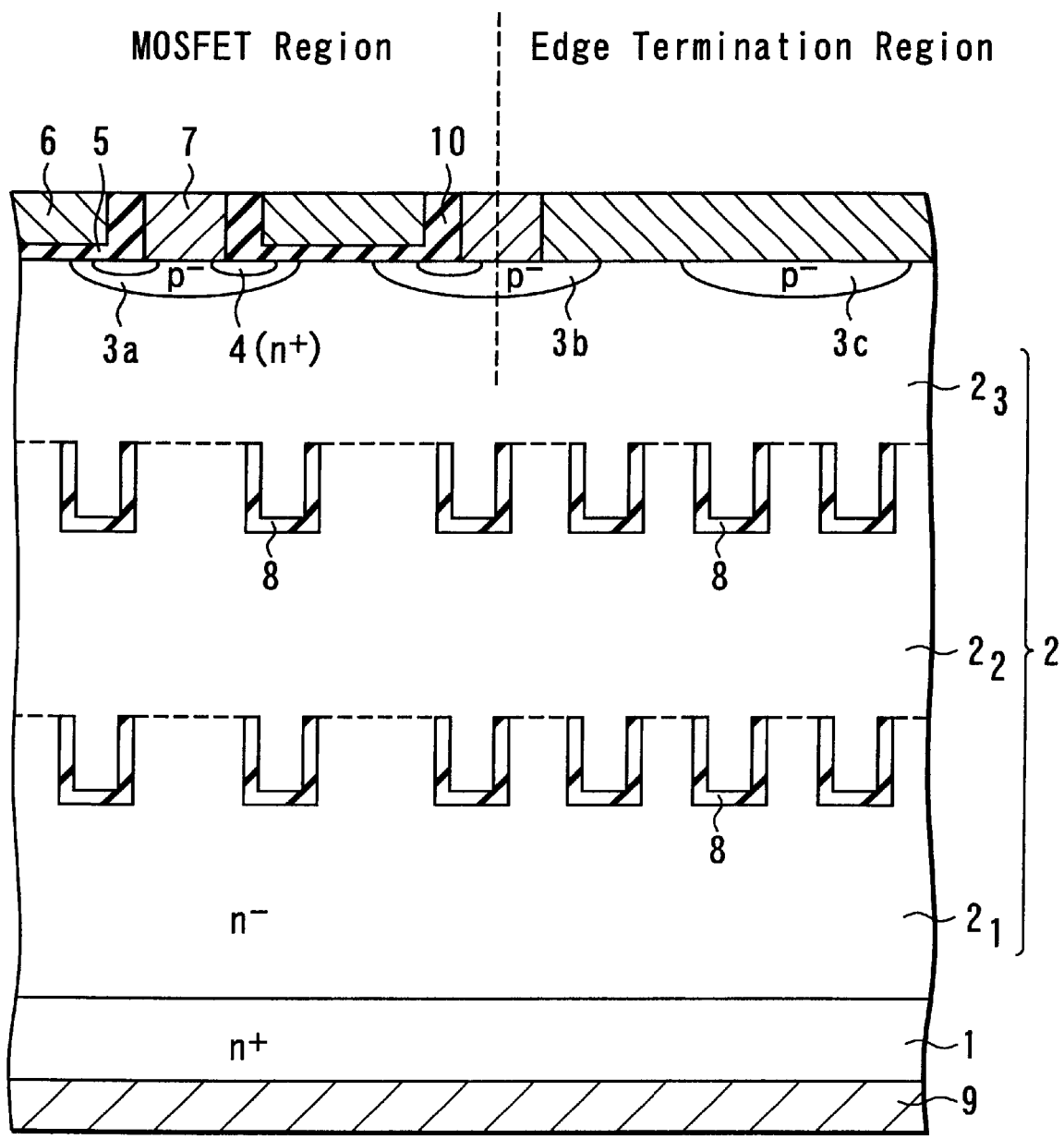
FIG. 21 is a sectional view of the element structure of a vertical power MOSFET according to a fourteenth embodiment of the present invention.

FIG. 21 is a sectional view of the element structure of a vertical power MOSFET according to a fourteenth embodiment of the present invention. In the fourteenth embodiment, the horizontal spacing between U-shaped buried layers buried in the $n^{31}$ drift layer in the MOSFET region differs from that in the edge termination region. Specifically, the spacing in the edge termination region is narrower than that in the MOSFET region.

The basic configuration of the MOSFET section at left of FIG. 21 is the same as that shown in FIG. 1 or FIG. 9. In the $n^{31}$ drift layer 2, a plurality of buried layers with a U-shaped cross section to trap carriers are formed at specific intervals in a striped pattern at the surface of the drift layers $2_1$, $2_2$ of the $n^-$ drift layers $2_1$, $2_2$, $2_3$ grown epitaxially in three stages. The buried layers 8 are made of a silicon oxide layer and are floating in the $n^{31}$ drift layer 2 in an electrically insulated manner. Since the configuration of the MOSFET except for the U-shaped buried layers is the same as that of FIG. 18, the same parts are indicated by the same reference numerals and repetitive explanation will be omitted.

In the fourteenth embodiment, the U-shaped buried layers 8 are buried in not only the MOSFET region but also the edge termination region of the power MOSFET. The right half region of FIG. 21 is the edge termination region. At the surface of the $n^{31}$ drift layer $2_3$ in the edge termination region, $p^-$ well layers 3b, 3c are formed as a guard ring. At the surface of the $n^{31}$ drift layers $2_1$, $2_2$ under the $p^-$ well layers 3b, 3c, the same U-shaped buried layers 8 as those in the MOSFET region are formed.

The U-shaped buried layers 8 buried in the $n^-$ drift layers $2_1$, $2_2$ are made of a silicon oxide layer. The horizontal spacing between U-shaped buried layers in the element region is made different from that in the edge termination region in such a manner that the spacing in the edge termination region is narrower than that in the element region. For example, the horizontal spacing between buried layers 8 in the element region is set to 6 μm and the spacing between buried layers 8 in the edge termination region is set to 4 μm.

Consider a case where the arrangement of buried layers is designed, taking only the MOSFET region into account. If the spacing between buried layers 8 is set to 6 μm, buried layers whose width is 1.6 μm and whose height is 2.5 μm are buried, the breakdown voltage of the MOSFET becomes 600 V. If the spacing between buried layers 8 in the edge termination region is also set to 6 μm as is the MOSFET region, the breakdown voltage of the MOSFET becomes 400 V. The reason is that the electric field points in the vertical direction in the MOSFET region, whereas the electric field inclines in the edge termination region, making the number of carriers trapped in the U-shaped buried layers 8 smaller than that in the element region, which lowers the breakdown voltage.

Setting the spacing between buried layers in the edge termination region to 4 μm, however, increases the number of buried layers in the edge termination region, increasing the number of carriers trapped in the buried layers as a whole in the edge termination region, which makes the breakdown voltage in the edge termination region equal to 600 V, the same voltage as the breakdown voltage in the MOSFET region.

(Fifteenth Embodiment)

Figure 22:
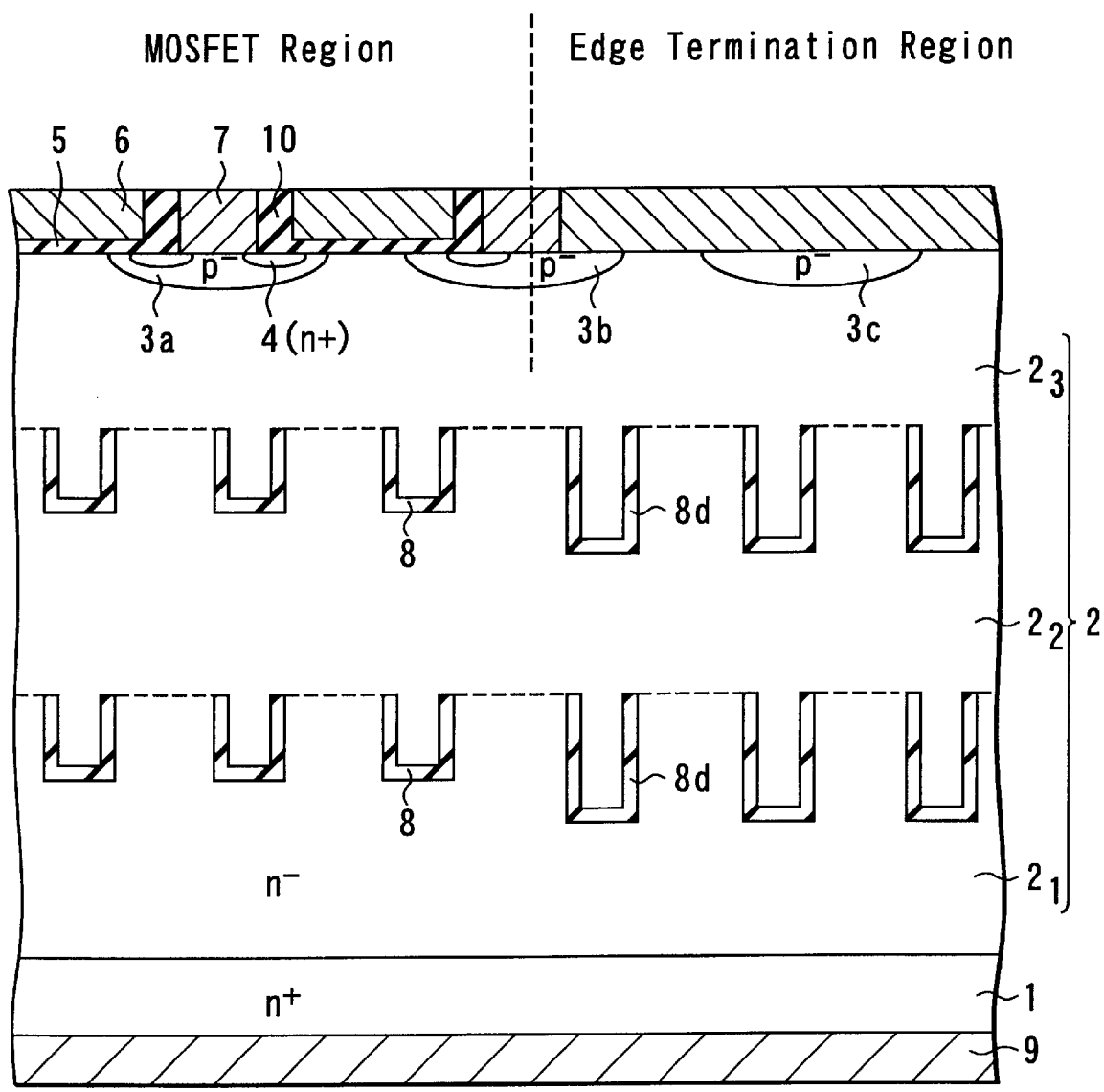
FIG. 22 is a sectional view of the element structure of a vertical power MOSFET according to a fifteenth embodiment of the present invention.

FIG. 22 is a sectional view of the element structure of a vertical power MOSFET according to a fifteenth embodiment of the present invention. The left half of FIG. 22 is the MOSFET region and has the same configuration as that of FIG. 18. The right half of FIG. 22 is the edge termination region. U-shaped buried layers 8d buried in the $n^{31}$ drift layers $2_1$, $2_2$ at the respective stages are arranged at the same intervals as the buried layers 8 in the MOSFET region but differ from the latter in the depth of the grooves (or the height of the buried layers). Specifically, the grooves of the U-shaped buried layers in the edge termination region are formed deeper than those of the U-shaped buried layers 8 in the MOSFET region.

As an example, the depth of the grooves of the U-shaped buried layers 8 in the MOSFET is set to 2.5 μm and the depth of the grooves of the U-shaped buried layers 8d in the edge termination region is set to 4.5 μm.

In the fifteenth embodiment, the grooves of the U-shaped buried layers 8 in the edge termination region are formed deeper, making the accumulation layers formed at the sidewalls of the U-shaped grooves so much longer, which increases the number of carriers trapped and further the number of carriers trapped in all the U-shaped buried layers in the edge termination region. As a result, the breakdown voltage of the edge termination region can be maintained to the same breakdown voltage as that of the MOSFET region as in the fourteenth embodiment.

While in the fifteenth embodiment, the width of the U-shaped buried layers 8 in the MOSFET region is made equal to the width of the U-shaped buried layers 8d in the edge termination region, the width of the U-shaped buried layers 8d in the edge termination region may be made larger than that in the MOSFET region. For example, the width in the MOSFET region is set to 1.6 μm and the width in the edge termination region is set to 3.7 μm, which also produces the same effect.

(Sixteenth Embodiment)

Figure 23:
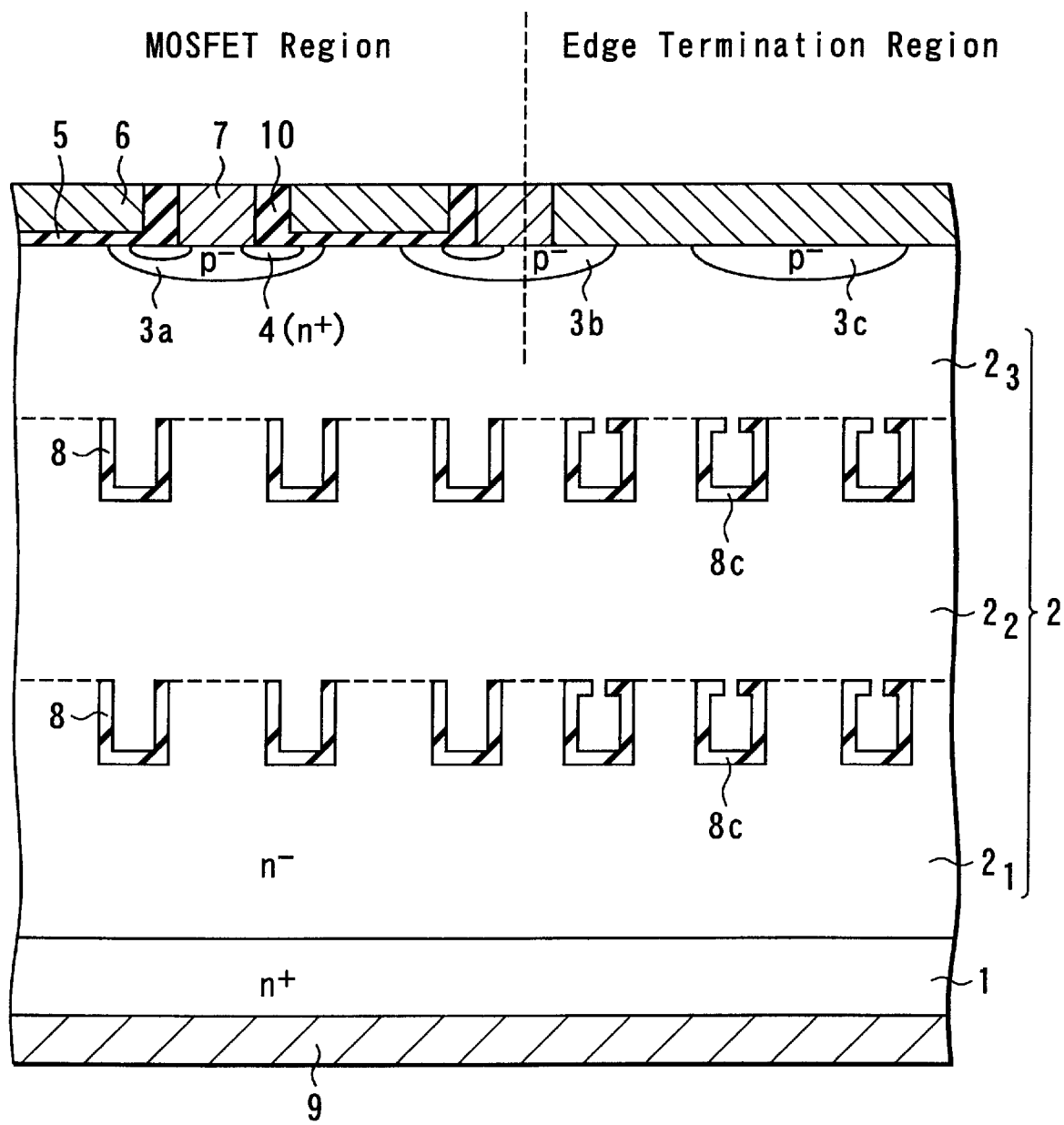
FIG. 23 is a sectional view of the element structure of a vertical power MOSFET according to a sixteenth embodiment of the present invention.

FIG. 23 is a sectional view of the element structure of a vertical power MOSFET according to a sixteenth embodiment of the present invention. In the sixteenth embodiment, U-shaped buried layers buried in the $n^{31}$ drift layer 2 in the MOSFET region take a different shape from that of U-shaped buried layers in the edge termination region. In the edge termination region, they have a U-shaped structure where the opening is narrowed.

In the MOSFET region at left in FIG. 23, a MOSFET is formed. In the $n^{31}$ drift layer 2, a plurality of buried layers 8 with a U-shaped cross section to trap carriers are formed at specific intervals in a striped pattern at the surface of the drift layers $2_1$, $2_2$ of the drift layers $2_1$, $2_2$, $2_3$ grown epitaxially in three stages. The buried layers 8 are made of a silicon oxide layer and are floating in the drift layer 2 in an electrically insulated manner. The configuration of the MOSFET excluding the drift layers is the same as that of FIG. 18, the component parts are indicated by the same reference numerals and repetitive explanation will be omitted.

The right half of FIG. 23 is the edge termination region. At the surface of the upper-stage $n^{31}$ drift layer $2_3$, $p^-$ well layers 3b, 3c are formed as a guard ring. At the surface of each of the $n^{31}$ drift layers $2_2$, $2_1$ below the $n^{31}$ drift layer $2_3$, U-shaped buried layers 8c made of the same oxide layer as that of the U-shaped buried layers in the MOSFET but differing in shape from the latter are formed. Specifically, the U-shaped buried layers 8c buried in the edge termination region have a U-shaped structure where the opening is narrowed. The spacing between buried layers, and the height, width, and film thickness of the buried layers in the edge termination region are made equal to those in the MOSFET region. For example, the width of the bottom of the U-shaped buried layer 8c is set to 2 μm and the width of its opening is set to 1 μm.

According to the sixteenth embodiment, the carriers trapped in the buried layers 8c in the edge termination region are less liable to escape to the $n^-$ drift layers $2_3$, $2_2$, which enables the breakdown voltage of the edge termination region to be maintained to the same breakdown voltage as that of the MOSFET as in the fourteenth embodiment.

According to fourteenth to sixteenth embodiments, the electric field in the drift layer can be divided effectively even in the edge termination region, which improves the breakdown voltage at the edge termination region. Since the direction of the electric field inclines obliquely with respect to the buried layer, carriers are difficult to trap and therefore the number of accumulated carriers is smaller than in the element region. However, when the spacing between buried layers in the edge termination region is made narrower to increase the number of buried layers or when the vertical length of the letter U of the buried layers in the edge termination region is made greater, the amount of accumulated carriers in the edge termination region increases. In addition, narrowing the opening of the buried layers in the edge termination region as compared with the bottom makes it more difficult for accumulated carriers to escape, which achieves the same breakdown voltage as at the element region.

(Seventeenth Embodiment)

Figure 24:
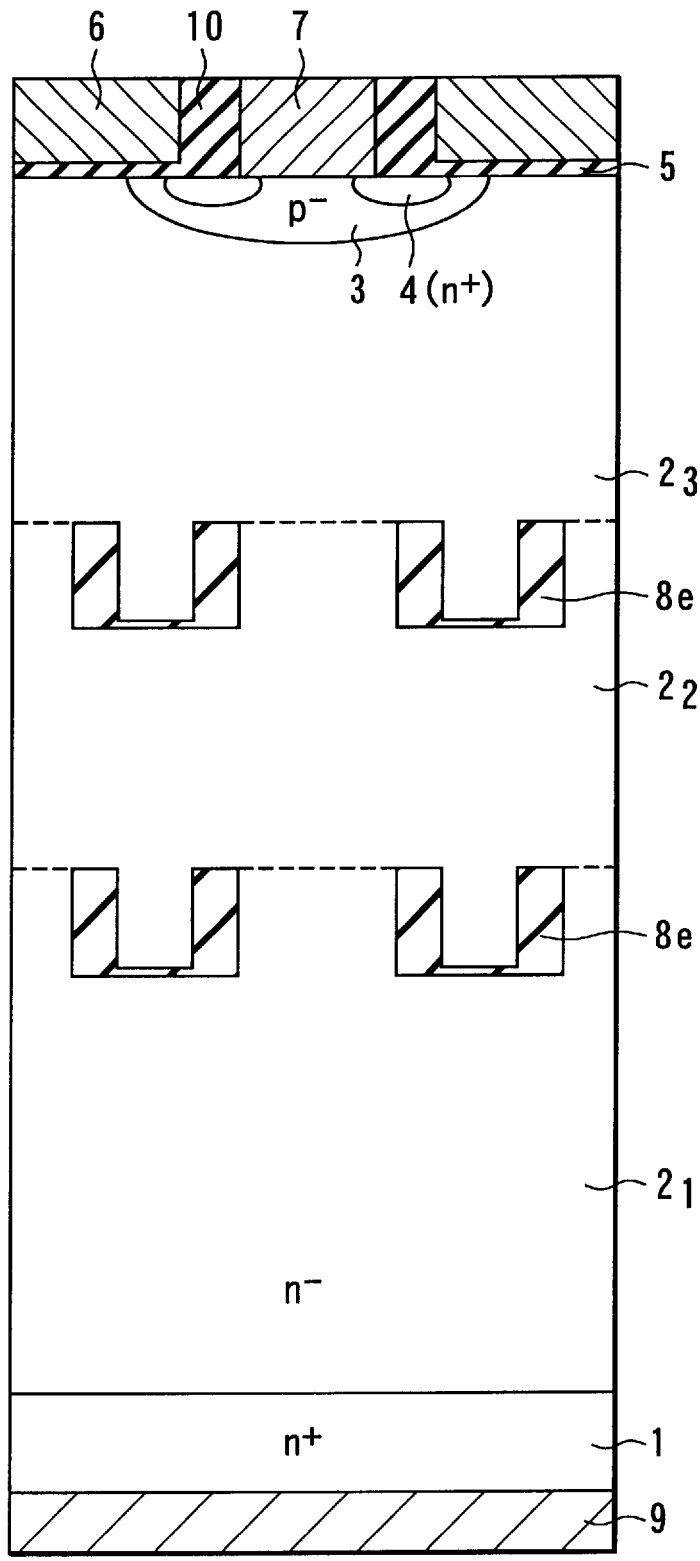
FIG. 24 is a sectional view of the element structure of a vertical power MOSFET according to a seventeenth embodiment of the present invention.

FIG. 24 is a sectional view of the element structure of a vertical power MOSFET according to a seventeenth embodiment of the present invention. In the seventeenth embodiment, the sidewall of a U-shaped buried layer is formed thicker than its bottom. Since the configuration of the seventeenth embodiment is the same as that of FIG. 1 or FIG. 9 except for the shape of the U-shaped buried layers, the same parts are indicated by the same reference numerals and repetitive explanation will be omitted.

In the seventeenth embodiment, the sidewall of each U-shaped buried layer $8e$ buried at the surface of the $n^{31}$ drift layers $2_1$, $2_2$ is formed thicker than its bottom. For example, the thickness of its sidewall is set to 0.3 $\mu$m and the thickness of its bottom is set to 0.1 $\mu$m.

The number of carriers accumulated in the accumulation layer is determined by the voltage applied to the U-shaped buried layer and the thickness of the buried layer. Therefore, making only the sidewall of the U-shaped buried layer $8e$ thicker weakens the electric field applied to the sidewall and increases the electric field applied to the thinner bottom, facilitating the formation of an accumulation layer at the bottom, which increases the number of carriers accumulated in the bottom.

In the vertical MOSFET, the electric field based on the applied voltage between the source and drain develops almost perpendicular to the surface of the substrate in the MOSFET region, whereas the electric field is applied obliquely because the source electrode and drain electrode are offset in the edge termination region. For this reason, the shape or arrangement of the buried layers in the MOSFET region have to be made different from those in the edge termination region as explained in the fourteenth to sixteenth embodiments.

In the seventeenth embodiment, an accumulation layer is easier to form at the bottom of the buried layer and the number of carriers accumulated at the bottom is increased. As a result, an accumulation layer formed at the inner wall of the U-shaped buried layer is not different so much from that in the MOSFET region, even when the electric field is applied obliquely to the edge termination region, which enables the breakdown voltage of the edge termination region to be maintained. Consequently, the same U-shaped buried layers $8e$ as those in the MOSFET region have only to be provided in the edge termination region, although the edge termination region is not shown in FIG. 24.

The vertical MOSFET in each of the eleventh to seventeenth embodiments may be combined with the Schottky barrier diode explained in FIG. 7 or FIGS. 8A and 8B.

In the eleventh to seventeenth embodiments, examples of burying a plurality of buried layers in a drift layer have been explained as means for solving the tradeoff between the on-resistance and breakdown voltage of a power semiconductor device. The tradeoff solving means is not limited to buried layers. Use of vertical Resurf layers produces a similar effect. The following is an explanation of such embodiments.

(Eighteenth Embodiment)

Figure 25:
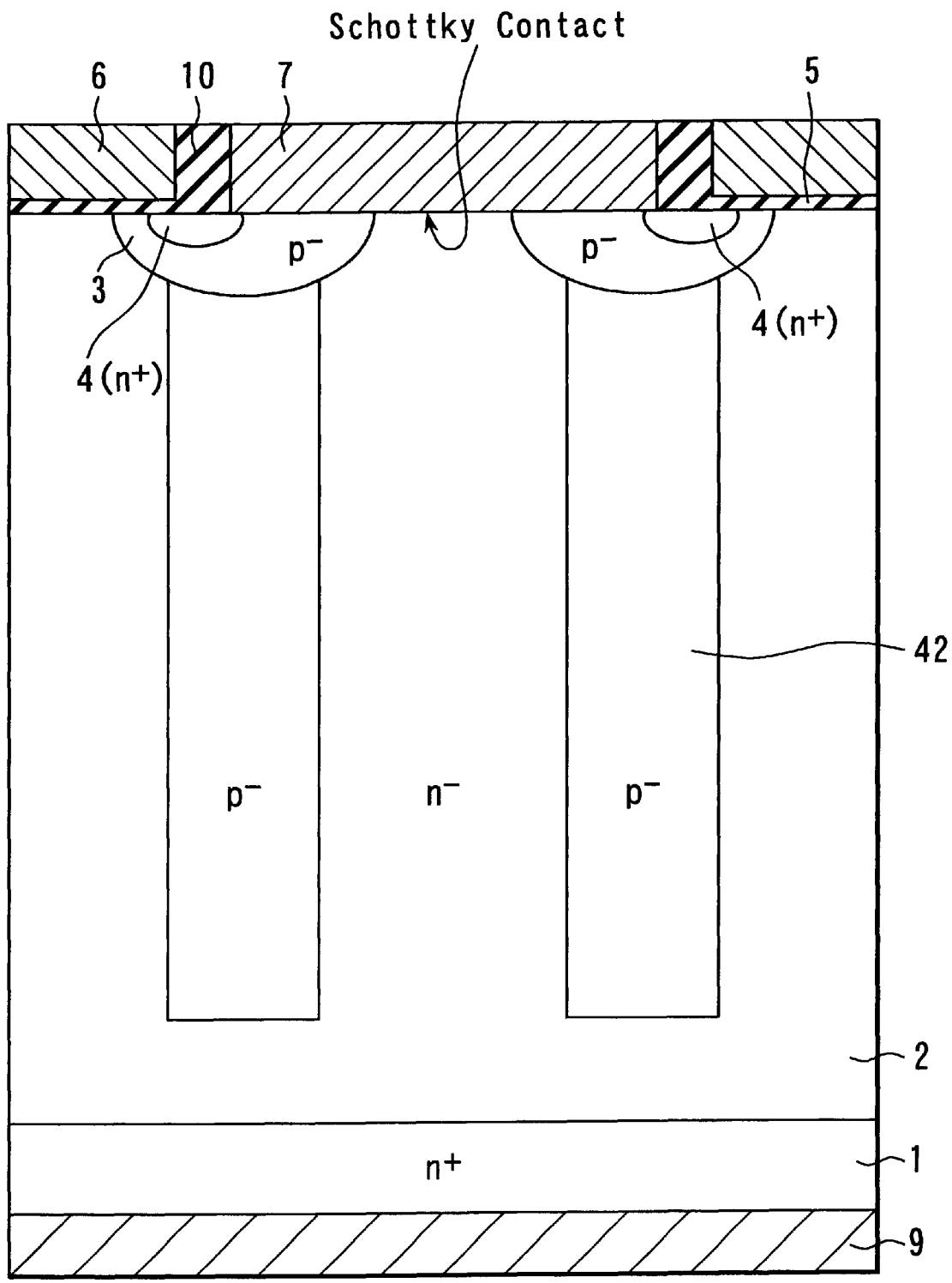
FIG. 25 is a sectional view of the element structure of a vertical power MOSFET according to an eighteenth embodiment of the present invention.

FIG. 25 is a sectional view of the element structure of a vertical power MOSFET according to a eighteenth embodiment of the present invention. The same parts as those in the above embodiment are indicated by the same reference numerals. On an $n^{30}$ silicon substrate 1, an $n^-$ drift layer 2 is formed. At the surface of the $n^{31}$ drift layer 2, $p^-$ well layers 3 are selectively formed. At the surface of each $p^-$ well layer 3, an $n^+$ source layer 4 is selectively formed. Above the $n^+$ source layer 4 and $n^-$ drift layer 2, a gate electrode 6 is formed via a gate insulating film 5.

A source electrode 7 is formed so as to connect to the $p^-$ well layer 3 and $n^+$ source layer 4. The source electrode 7 is connected electrically to the $n^{31}$ drift layer 2 by Schottky contact. A drain electrode 9 (first main electrode) is connected electrically to the $n^+$ silicon substrate 1. In the eighteenth embodiment, a $p^-$ Resurf layer 42 connected to the $p^-$ well layer 3 is formed in the $n^{31}$ drift layer 2.

Providing the vertical Resurf layer 42 enables a high breakdown voltage to be realized even when the dopant concentration in the $n^{31}$ drift layer 2 is raised. Use of the vertical Resurf layer and the higher concentration $n^{31}$ drift layer 2 makes it possible to decrease the on-resistance.

Furthermore, connecting a Schottky barrier diode in parallel with the built-in diode produces the same effect as the fifth embodiment (FIG. 7).

(Nineteenth Embodiment)

Figure 26A:
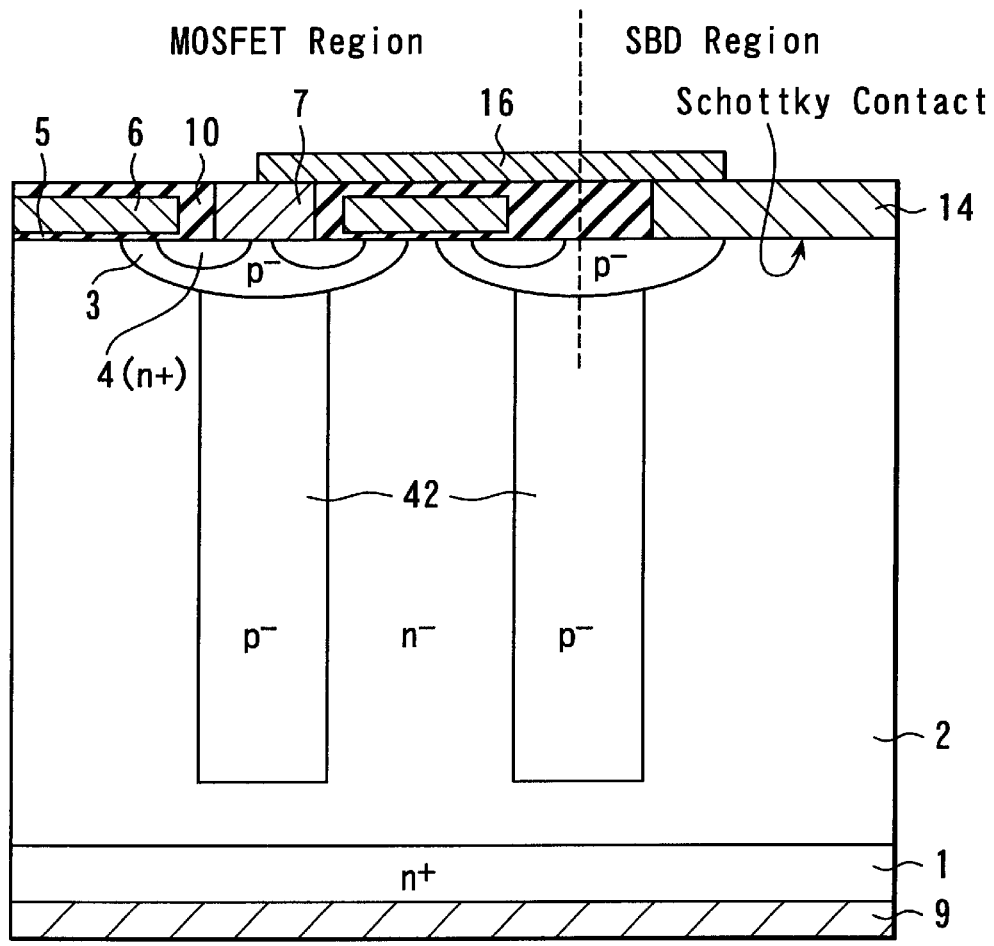
FIGS. 26A and 26B show the element structure of a vertical power MOSFET according to a nineteenth embodiment of the present invention, where
Figure 26B:
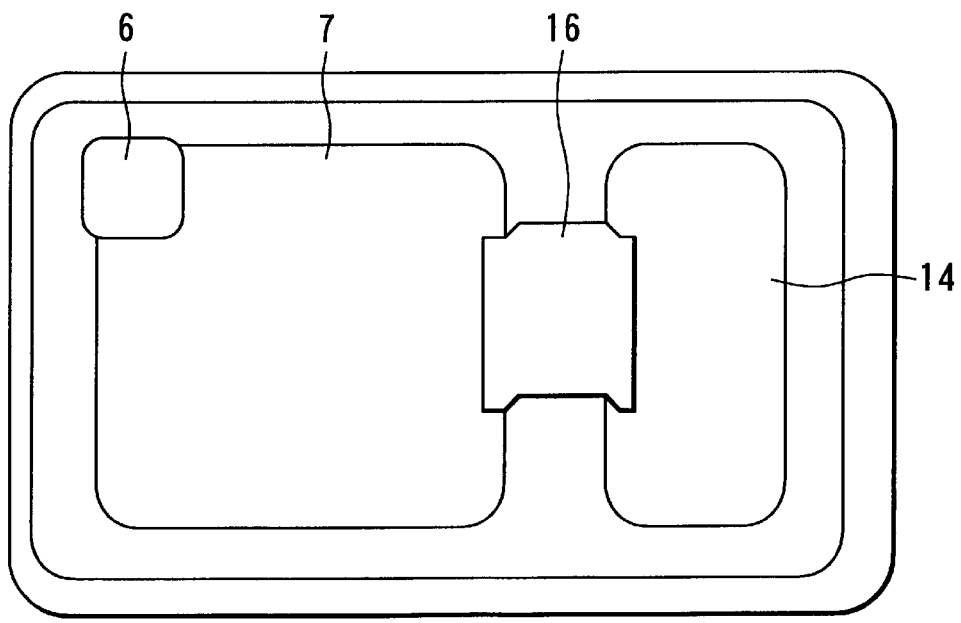

FIGS. 26A and 26B show a vertical power MOSFET according to a nineteenth embodiment of the present invention. FIG. 26A is a sectional view and FIG. 26B is a plan view. The like parts as those in the eighteenth embodiment are indicated by the same reference numerals and repetitive explanation will be omitted.

The configuration of the MOSFET itself is the same as that of the seventeenth embodiment (FIG. 25). In the nineteenth embodiment, $p^-$ Resurf layers 42 connected to $p^-$ well layers 3 are formed in an $n^{31}$ drift layer 2. In addition, a Schottky barrier diode formed in a region (SBD region) different from the region where the power MOSFET has been formed is connected in parallel with a built-in diode. Forming the power MOSFET and SBD separately enables both of them to be formed with the optimum element areas on a single chip.

The separately formed power MOSFET and SBD are connected with a metal film (interconnect) 16 formed by evaporation as shown in FIGS. 26A and 26B. They may be connected by wire bonding in place of the metal film 16.

While in the above embodiments, the buried layers are made of a silicon oxide layer (SiO$_2$), they may be made of a silicon nitride layer (Si$_3$N$_4$). The buried layers are not limited to such insulating material as oxide layers or nitride layers, wideband gap semiconductors, such as SiC, may be used.

Furthermore, the present invention can be applied to not only semiconductor elements using silicon (Si) but also compound semiconductors, such as Sic. Particularly in GaAs and GaN, burying wider bandgap semiconductors, such as AlAs or AlN, as buried layers enables carriers to be trapped as in buried layers of insulating material, which makes it possible to make the whole element of a single crystal.

In addition, the present invention can be applied to not only the planar gate vertical power MOSFETs explained in the embodiments but also trench gate power MOSFETs, and further the following elements: SBD (Schottky Barrier Diode), SIT (Static Induction Transistor), and IGBT (Insulated Gate Bipolar Transistor).

Still furthermore, although the U-shaped buried layers have rectangular corners, they may, of course, have round corners. While in the embodiments, the first conductivity type has been the n type and the second conductivity type has been the p type, they may be reversed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power semiconductor device comprising:
   a first semiconductor layer of a first conductivity type having a first and a second main surface that oppose to each other;
   a first main electrode electrically connected to the second main surface of the first semiconductor layer;
   a second semiconductor layer of a second conductivity type selectively formed on the first main surface of the first semiconductor layer;
   a third semiconductor layer of the first conductivity type selectively formed on a surface of the second semiconductor layer;
   a second main electrode electrically connected to the surface of the second semiconductor layer and a surface of the third semiconductor layer;
   a gate electrode formed via a gate insulating film above the third semiconductor layer, the second semiconductor layer, and the first semiconductor layer; and
   buried layers whose cross section is shaped like a letter U and which are made of either an insulating layer or a semiconductor layer having a wider bandgap than that of the first semiconductor layer and are provided in the first semiconductor layer in such a manner that a set of at least two of the buried layers are arranged with a pitch of d and a spacing of g in a horizontal direction perpendicular to a vertical direction passing through the first main electrode and the second main electrode and at least one stage of the set of at least two buried layers is arranged in the vertical direction,
   a ratio A of a product of a height H of the U-shaped buried layers and the arrangement pitch d to the spacing g between adjacent ones of the U-shaped buried layers being expressed as:

$A(=Hd/g) \leq 13.2$

2. The power semiconductor device according to claim 1, wherein the ratio A is expressed as:

$A \leq 3.0$

3. The power semiconductor device according to claim 1, further comprising a Schottky barrier diode provided on the first semiconductor layer and connected in parallel with a built-in diode formed between the second semiconductor layer and the first semiconductor layer.

4. A power semiconductor device comprising:
   a first semiconductor layer of a first conductivity type having a first and a second main surface that face each other;
   a first main electrode electrically connected to the second main surface of the first semiconductor layer;
   a second semiconductor layer of a second conductivity type selectively formed on the first main surface of the first semiconductor layer;
   a third semiconductor layer of the first conductivity type selectively formed on a surface of the second semiconductor layer;
   a second main electrode electrically connected to the surface of the second semiconductor layer and a surface of the third semiconductor layer;
   a gate electrode formed via a gate insulating film above the third semiconductor layer, the second semiconductor layer, and the first semiconductor layer; and
   buried layers whose cross section is shaped like a letter U and which are made of either an insulating layer or a semiconductor layer having a wider bandgap than that of the first semiconductor layer and are provided in the first semiconductor layer in such a manner that a set of at least two of the buried layers are arranged with a pitch of d and a spacing of g in a horizontal direction perpendicular to a vertical direction passing through the first main electrode and the second main electrode and at least one stage of the set of at least two buried layers is arranged in the vertical direction,
   a ratio B of a sum of a width W and a height H of the U-shaped buried layers to the arrangement pitch d being expressed as:

$B(=(W+H)/d) \leq 0.3$

5. The power semiconductor device according to claim 4, wherein the ratio B is expressed as:

$B(=(W+H)/d)0.5$

6. The power semiconductor device according to claim 4, wherein the ratio A of the product of the height H of the U-shaped buried layers and the arrangement pitch d to the spacing g between adjacent ones of the U-shaped buried layers is expressed as:

$A(=Hd/g) \leq 13.2$

7. The power semiconductor device according to claim 4, further comprising a Schottky barrier diode provided on the first semiconductor layer and connected in parallel with a built-in diode formed between the second semiconductor layer and the first semiconductor layer.

* * * * *